(12) United States Patent
Nosaka

(10) Patent No.: US 11,843,367 B2
(45) Date of Patent: Dec. 12, 2023

(54) FILTER DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 800 days.

(21) Appl. No.: 16/984,158

(22) Filed: Aug. 4, 2020

(65) Prior Publication Data

US 2020/0366272 A1 Nov. 19, 2020

Related U.S. Application Data

(63) Continuation of application No. PCT/JP2018/041280, filed on Nov. 7, 2018.

(30) Foreign Application Priority Data

Feb. 5, 2018 (JP) ................. 2018-018284

(51) Int. Cl.
*H03H 9/64* (2006.01)
*H03H 9/58* (2006.01)
(Continued)

(52) U.S. Cl.
CPC ............ *H03H 9/6406* (2013.01); *H03H 9/58* (2013.01); *H03H 9/6433* (2013.01);
(Continued)

(58) Field of Classification Search
None
See application file for complete search history.

(56) References Cited

U.S. PATENT DOCUMENTS 6,710,677 B2 * 3/2004 Beaudin ............... H03H 9/6463
330/306
7,659,796 B2 * 2/2010 Funami .................. H03H 9/725
333/133
(Continued)

FOREIGN PATENT DOCUMENTS

CN 102405596 A 4/2012
JP 2004-166258 A 6/2004
(Continued)

OTHER PUBLICATIONS

English Translation of Written Opinion dated Jan. 8, 2019 for PCT/JP2018/041280 filed on Nov. 7, 2018, 8 pages
(Continued)

*Primary Examiner* — Kenneth B Wells
(74) *Attorney, Agent, or Firm* — XSENSUS LLP

(57) ABSTRACT

A filter device according to an embodiment of the present disclosure includes a first filter and a second filter that are connected in parallel between a first terminal and a second terminal. The first filter includes multiple series arm resonators. The series arm resonators are disposed in series in a path from the first terminal via the first filter to the second terminal. The series arm resonators include a first series arm resonator and a second series arm resonator. Under a condition that a value obtained by dividing a difference between an antiresonance frequency and a resonance frequency of each series arm resonator by the resonance frequency is defined as a fractional bandwidth, a first fractional bandwidth of the first series arm resonator is different from a second fractional bandwidth of the second series arm resonator.

19 Claims, 24 Drawing Sheets

(51) Int. Cl.
*H03H 9/68* (2006.01)
*H03H 9/70* (2006.01)
*H03H 9/72* (2006.01)
*H04B 1/04* (2006.01)
*H04B 1/16* (2006.01)

(52) U.S. Cl.
CPC ............ *H03H 9/6489* (2013.01); *H03H 9/68* (2013.01); *H03H 9/703* (2013.01); *H03H 9/725* (2013.01); *H04B 1/04* (2013.01); *H04B 1/16* (2013.01)

(56) References Cited

U.S. PATENT DOCUMENTS

| | | | | |
|---|---|---|---|---|
| 8,004,370 | B2* | 8/2011 | Yamagata | H03H 9/725 333/195 |
| 9,705,473 | B2* | 7/2017 | David | H03H 7/38 |
| 9,806,692 | B2* | 10/2017 | Kishino | H03H 9/02614 |
| 10,250,214 | B2* | 4/2019 | Kato | H03H 7/0161 |
| 11,031,921 | B2* | 6/2021 | Nosaka | H03H 9/725 |
| 11,211,676 | B2* | 12/2021 | Zhou | H01P 1/208 |
| 11,283,428 | B2* | 3/2022 | Nosaka | H03H 9/68 |
| 11,316,499 | B2* | 4/2022 | Nosaka | H03H 9/6436 |
| 2014/0218129 | A1 | 8/2014 | Fujiwara et al. | |

FOREIGN PATENT DOCUMENTS

| | | |
|---|---|---|
| JP | 2008-160629 A | 7/2008 |
| JP | 2013-197772 A | 9/2013 |
| WO | 2010/122786 A1 | 10/2010 |
| WO | 2013/080461 A1 | 6/2013 |
| WO | 2017/204347 A1 | 11/2017 |

OTHER PUBLICATIONS

International Search Report and Written Opinion dated Jan. 8, 2019 for PCT/JP2018/041280 filed on Nov. 7, 2018, 10 pages including English Translation of the International Search Report.
Office Action dated Feb. 28, 2023 in Chinese Patent Application No. 201880088543.X, 15 pages.

* cited by examiner

| fr (MHz) | fa (MHz) | BWR (%) |
|---|---|---|
| 1380.0 | 1437.3 | 7.91 |
| 1400.0 | 1438.3 | 7.77 |
| 1420.0 | 1439.3 | 7.63 |
| 1440.0 | 1440.3 | 7.49 |
| 1460.0 | 1441.3 | 7.35 |
| 1480.0 | 1442.3 | 7.21 |
| 1500.0 | 1443.3 | 7.07 |
| 1520.0 | 1444.3 | 6.93 |

1(2, 100)

3(4, 200)

FILTER DEVICE, RADIO-FREQUENCY FRONT-END CIRCUIT, AND COMMUNICATION APPARATUS

CROSS REFERENCE TO RELATED APPLICATIONS

This is a continuation application of PCT International Application No. PCT/JP2018/041280 filed on Nov. 7, 2018, designating the United States of America, which is based on and claims priority of Japanese Patent Application No. 2018-018284 filed on Feb. 5, 2018. The entire contents of the above-identified applications, including the specifications, drawings and claims are incorporated herein by reference in their entirety.

TECHNICAL FIELD

The present disclosure relates to a filter device, a radio-frequency (RF) front-end circuit, and a communication apparatus.

BACKGROUND ART

A conventionally known filter device has a parallel arrangement of two filters of different passbands for a wider passband. For example, in a radio receiver circuit disclosed in Japanese Patent Laying-Open No. 2008-160629 (PTL 1), two bandpass filters of different passbands are arranged in parallel for a wider passband.

CITATION LIST

Patent Literature

PTL 1: Japanese Patent Laying-Open No. 2008-160629

SUMMARY

Technical Problems

Typically, a passband of a filter device is formed through parallel arrangement of a first filter and a second filter, as in the radio receiver circuit disclosed in PTL 1. The center frequency of the passband of the second filter is higher than the center frequency of the passband of the first filter. In other words, of the passband of the filter device, a frequency band (on the low band part of the passband, or "low band side") lower than the center frequency of the filter device is mainly formed by the first filter (low band sided filter), and a frequency band (on the high band part of the passband, or "high band sided side") higher than the center frequency of the filter device is mainly formed by the second filter (high band sided filter).

If the amount of attenuation of the low band sided filter in the passband of the high band sided filter or the amount of attenuation of the high band sided filter in the passband of the low band sided filter is small, a passband insertion loss of the filter device increases.

However, none of highly damping the low band sided filter in the passband of the high band sided filter or highly damping the high band sided filter in the passband of the low band sided filter is reflected in the radio receiver circuit disclosed in PTL 1.

The present disclosure has been made to solve the above problem and other problems and aims to reduce a passband insertion loss of a filter device.

Solutions

A filter device according to an embodiment of the present disclosure has a first passband. The filter device includes a first filter and a second filter connected in parallel with each other between a first terminal and a second terminal. The passband of the filter device includes at least part of a second passband of the first filter and at least part of a third passband of the second filter. The second passband and the third passband being narrower than the passband of the filter device. The third passband having a center frequency higher than a center frequency of the second passband. The first filter includes a plurality of series arm resonators connected in series with each other in a path from the first terminal via the first filter to the second terminal. The plurality of series arm resonators include a first series arm resonator and a second series arm resonator, and under a condition that a value obtained by dividing a difference between an antiresonance frequency and a resonance frequency of each series arm resonator by the resonance frequency is defined as a fractional bandwidth, a first fractional bandwidth of the first series arm resonator is different from a second fractional bandwidth of the second series arm resonator.

The filter device according selected embodiment of the present disclosure, in which the first filter includes the series arm resonators of different fractional bandwidths, is able to reduce an insertion loss at a high band edge of the passband of the filter device.

A filter device according to another embodiment of the present disclosure has a first passband. The filter device includes a first filter and a second filter connected in parallel with each other between a first terminal and a second terminal. The passband of the filter device includes at least part of a second passband of the first filter and at least part of a third passband of the second filter. The second passband and the third passband being narrower than the passband of the filter device. The third passband having a center frequency higher than a center frequency of the second passband. The second filter includes a first parallel arm resonator connected between a grounding node and a first connecting node on a path from the first terminal via the second filter to the second terminal, and a second parallel arm resonator connected between the grounding node and a second connecting node on the path from the first terminal via the second filter to the second terminal, the second connecting node being different from the first connecting node. Under a condition that a value obtained by dividing a difference between an antiresonance frequency and a resonance frequency of each parallel arm resonator by the resonance frequency is defined as a fractional bandwidth, a fourth fractional bandwidth of the first parallel arm resonator is different from a fifth fractional bandwidth of the second parallel arm resonator.

The filter device according to the other embodiment of the present disclosure, in which the second filter includes the parallel arm resonators of different fractional bandwidths, is able to reduce an insertion loss at a low band edge of the passband of the filter device.

Advantageous Effects

The filter device according to the present disclosure can reduce a passband insertion loss of the filter device.

DESCRIPTION OF EMBODIMENTS

Figure 1:
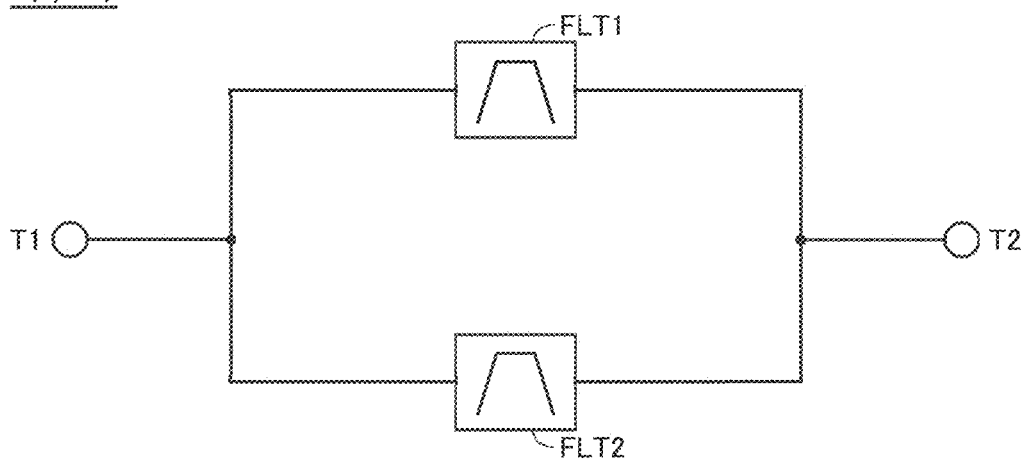
FIG. 1 is a circuit configuration diagram of a filter device according to an embodiment.

The embodiments of the present disclosure will now be described in detail with reference to the accompanying drawings, in which the same or corresponding components will be designated by the same reference characters, and description thereof will not be basically repeated.

FIG. 1 is a circuit configuration diagram of a filter device 1 according to an embodiment. As shown in FIG. 1, filter device 1 includes a filter FLT1 (first filter), a filter FLT2 (second filter), an input-output terminal T1 (first terminal), and an input-output terminal T2 (second terminal). Filters FLT1 and FLT2 are connected in parallel with each other between input-output terminals T1 and T2. Specifically, filter FLT1 has a first terminal connected to input-output terminal T1 and a second terminal connected to input-output terminal T2. Filter FLT2 has a first terminal connected to input-output terminal T1 and a second terminal connected to input-output terminal T2.

Each of filters FLT1 and FLT2 includes elastic wave resonators as a series arm resonator and a parallel arm resonator. The elastic wave resonator is, for example, a surface acoustic wave (SAW) resonator, a bulk acoustic wave (BAW) resonator, a film bulk acoustic wave resonator (FBAR), or a solidly mounted (SM) resonator. In Embodiment 1, high band sided filter FLT2 may be an LC filter formed of an LC resonance circuit.

Figure 2:
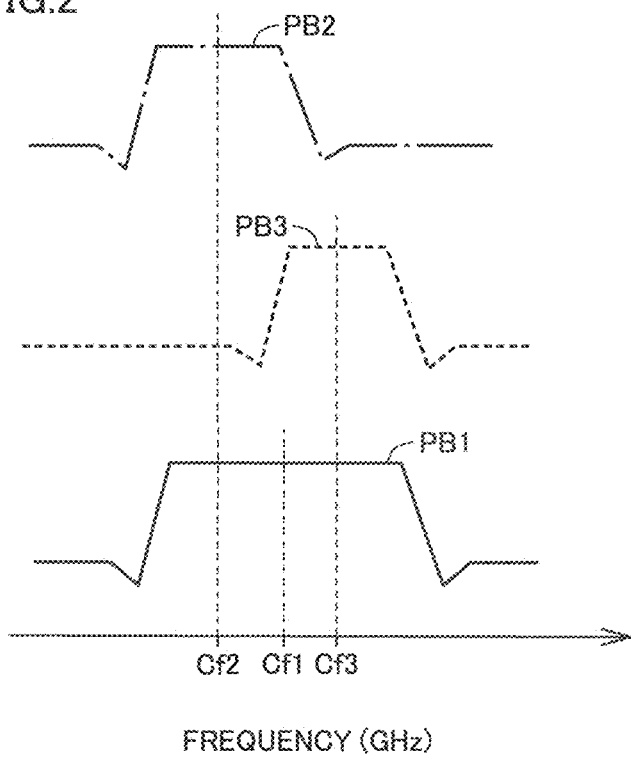
FIG. 2 is a graph that shows the relation among a first passband of the filter device, a second passband of a low band sided filter, and a third passband of a high band sided filter in FIG. 1.

FIG. 2 is a graph that shows the relation among a passband PB1 (first passband) of filter device 1, a passband PB2 (second passband) of filter FLT1, and a passband PB (third passband) of filter FLT2 in FIG. 1. In FIG. 2, frequencies Cf1 to Cf3 are center frequencies of passbands PB1 to PB3, respectively. Herein, the passband refers to any consecutive frequency bands in which an insertion loss falls within the range from a minimum value of the insertion loss to a value obtained by adding 3 dB to the minimum value (i.e., 3 dB down from the minimum value).

As shown in FIG. 2, passband PB1 overlaps with a part of passband PB2 and part of passband PB3. Passband PB2 is narrower than passband PB1. Passband PB3 is narrower than passband PB1. Passband PB3 has a center frequency Cf3 higher than a center frequency Cf2 of passband PB2. Of passband PB1, a frequency band lower than center frequency Cf1 is mainly formed by filter FLT1, and a frequency band higher than center frequency Cf1 is mainly formed by filter FLT2. Filter FLT1 is a filter that forms passband PB2, which is called a low band sided filter. Filter FLT2 is a filter that forms passband PB3, which is called a high band sided filter.

In passband PB3, as the amount of attenuation of filter FLT1 is larger, fewer signals are consumed by filter FLT1, and more signals pass through filter FLT2. This reduces an insertion loss of filter device 1 at the highest frequency (high band edge) of passband PB1.

In passband PB2, as the amount of attenuation of filter FLT2 is larger, fewer signals are consumed by filter FLT2, and more signals pass through filter FLT1. This reduces an insertion loss of filter device 1 at the lowest frequency (low band edge) of passband PB1.

In passband PB3, an attenuation pole of filter FLT1 occurs in the vicinity of an antiresonance frequency of the series arm resonator included in filter FLT1. Thus, multiple series arm resonators provided in filter FLT1 form multiple attenuation poles of filter FLT1 in the vicinity of passband PB3. Further, increasing the frequency difference in the antiresonance frequency of multiple series arm resonators in filter FLT1 can increase the frequency difference of multiple attenuation poles of filter FLT1 in the vicinity of passband PB3, resulting in a wider attenuation bandwidth. Thus, the amount of attenuation of filter FLT1 in passband PB3 can be increased.

In passband PB2, an attenuation pole of filter FLT2 occurs in the vicinity of a resonance frequency of the parallel arm resonator included in filter FLT2. Thus, multiple parallel arm resonators provided in filter FLT2 form multiple attenuation poles of filter FLT2 in the vicinity of passband PB2. Further, increasing the frequency difference in the resonance frequency of multiple parallel arm resonators in filter FLT2 can increase the frequency difference of multiple attenuation poles of filter FLT2 in the vicinity of passband PB2, resulting in a wider attenuation bandwidth. Thus, the amount of attenuation of filter FLT2 in passband PB2 can be increased.

The impedance of each of elastic wave resonators of the series arm resonator and the parallel arm resonator has a maximum at the antiresonance frequency and a minimum at the resonance frequency.

In Embodiment 1, thus, the frequency difference between two attenuation poles of the low band sided filter can be increased in the passband of the high band sided filter by providing two series arm resonators of different fractional bandwidths in multiple series arm resonators, constituting a low band sided filter, to shift the antiresonance frequencies. Consequently, the amount of attenuation of the low band sided filter can be increased in the passband of the high band sided filter, thereby reducing the insertion loss at the high band edge of the passband of the filter device.

In Embodiment 2, the frequency difference between two attenuation poles of the high band sided filter can be increased in the passband of the low band sided filter by providing two parallel arm resonators of different fractional bandwidths in multiple parallel arm resonators, constituting the high band sided filter, to shift the resonance frequencies. Consequently, the amount of attenuation of the high band sided filter can be increased in the passband of the low band sided filter, thereby reducing the insertion loss at the low band edge of the passband of the filter device.

In the present embodiment, the fractional bandwidth refers to a percentage (%) obtained by dividing a difference between an antiresonance frequency and a resonance frequency of a series arm resonator or a parallel arm resonator by the resonance frequency.

Figures 3A, 3B:
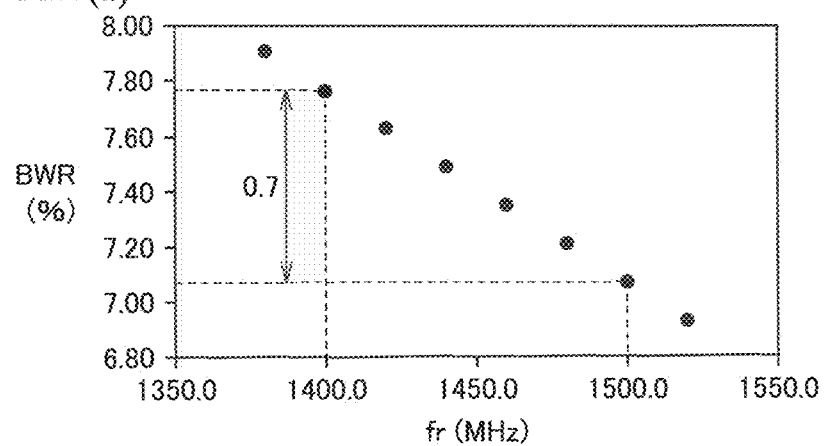
FIG. 3(a) is a chart showing the relation between a resonance frequency and a fractional bandwidth of an elastic wave resonator according to an embodiment and FIG. 3(b) is a chart of associated values.

FIG. 3(a) is a chart showing the relation between a resonance frequency fr and a fractional bandwidth BWR of a typical elastic wave resonator. As resonance frequency fr is changed, fractional bandwidth BWR changes. When a typical filter device is configured using multiple elastic wave resonators, the frequency difference in resonance frequency fr of multiple elastic wave resonators is generally 100 MHz or less. As shown in the graph of FIG. 3(a), and the associated table of values in FIG. 3(b), as resonance frequency fr is changed by 100 MHz, fractional bandwidth BWR changes by about 0.7%. It is thus assumed below that two fractional bandwidths are different from each other when the difference between the two fractional bandwidths is 0.8% or more, and that two fractional bandwidths are equal to each other when the difference between the two fractional bandwidths is less than 0.8%.

When the elastic wave resonator is a SAW resonator, the fractional bandwidth of the elastic wave resonator can be changed by providing a first adjustment film formed of an insulator or a dielectric body between interdigitated electrodes and a piezoelectric substrate and changing the thickness of the first adjustment film. The fractional bandwidth is largest in the absence of the first adjustment film, and the fractional bandwidth decreases with a larger thickness of the first adjustment film. Also, the fractional bandwidth of the SAW resonator can be changed by providing a second adjustment film formed of an insulator or a dielectric body in a manner of covering the interdigitated electrodes and changing the thickness of the second adjustment film. The fractional bandwidth is largest in the absence of the second adjustment film, and the fractional bandwidth decreases with a larger thickness of the second adjustment film.

When the elastic wave resonator is a BAW resonator, the fractional bandwidth can be changed by changing the material for a piezoelectric body between the opposing electrodes.

Embodiment 1

Figure 4:
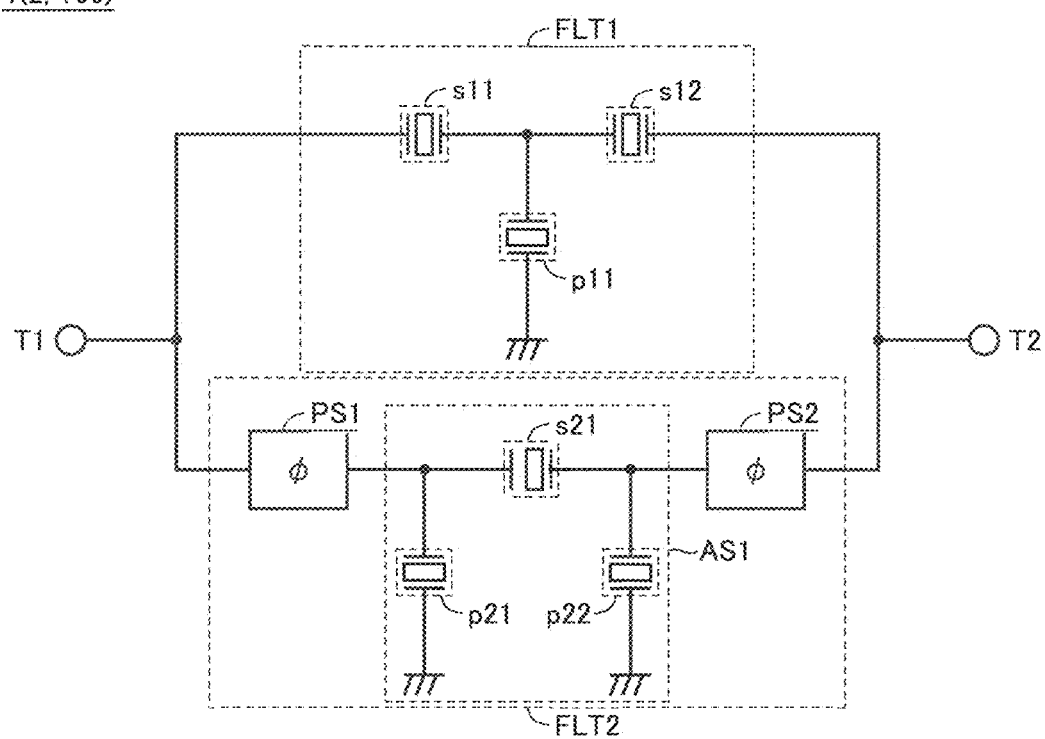
FIG. 4 is a circuit configuration diagram specifically showing configurations of the low band sided filter and the high band sided filter in FIG. 1.

Embodiment 1 will describe a case where multiple series arm resonators constituting a low band sided filter include two series arm resonators of different fractional bandwidths. FIG. 4 is a circuit configuration diagram specifically showing the configurations of filters FLT1 and FLT2 in FIG. 1. Each of a filter device 100 according to Comparative Example 1 and a filter device 2 according to Embodiment 2, which will be described below, also has a circuit configuration shown in FIG. 4.

As shown in FIG. 4, filter FLT1 includes series arm resonators s11 and s12 and a parallel arm resonator p11. Series arm resonator s11 (first series arm resonator) and series arm resonator s12 (second series arm resonator) are connected in series with each other between input-output terminals T1 and T2. Parallel arm resonator p11 is connected between a grounding point and a connecting point between series arm resonators s11 and s12.

Filter FLT2 includes a phase shifter PS1 (first phase shifter), a phase shifter PS2 (second phase shifter), and a filter circuit AS1. Phase shifter PS1 is connected between filter circuit AS1 and input-output terminal T1. Phase shifter PS2 is connected between filter circuit AS1 and input-output terminal T2.

Filter circuit AS1 includes a series arm resonator 21, and parallel arm resonators p21 and p22. Series arm resonator s21 is connected between phase shifters PS1 and PS2. Parallel arm resonator p21 is connected between the grounding point and a connecting point between phase shifter PS1 and series arm resonator s21. Parallel arm resonator p22 is connected between the grounding point and a connecting point between phase shifter PS2 and series arm resonator s21. Phase shifters PS1 and PS2 are configured to increase the impedance of filter FLT2 in passband PB2 of filter FLT1.

Table 1 below shows resonance frequency fr, antiresonance frequency fa, fractional bandwidth BWR, and a capacitance of each of series arm resonators s11 and s12, parallel arm resonator p11, series arm resonator s21, and parallel arm resonators p21 and p22 in filter device 1.

TABLE 1

|  |  |  | fr [MHz] | fa [MHz] | BWR [%] | Capacitance [pF] |
|---|---|---|---|---|---|---|
| First filter FLT1 | Series arm resonator | s11 | 1443.4 | 1551.2 | 7.466 | 0.700 |
|  | Series arm resonator | s12 | 1454.4 | 1510.4 | 3.852 | 1.507 |
|  | Parallel arm resonator | p11 | 1374.7 | 1432.0 | 4.171 | 2.052 |
| Second filter FLT2 | Series arm resonator | s21 | 1519.6 | 1574.2 | 3.591 | 5.278 |
|  | Parallel arm resonator | p21 | 1455.4 | 1511.4 | 3.848 | 3.043 |
|  | Parallel arm resonator | p22 | 1454.4 | 1510.4 | 3.852 | 3.524 |

As shown in Table 1, in filter device 1, a difference in resonance frequency fr between series arm resonators s11 and s12 is 11 MHz, whereas a difference in antiresonance frequency fa therebetween is 40.8 MHz. The difference in antiresonance frequency fa is about four times as large as the difference in resonance frequency fr. In filter device 1, fractional bandwidth BWR (first bandwidth) of series arm resonator s11 is made larger than fractional bandwidth BWR (second bandwidth) of series arm resonator s12 in filter device 1 by mainly shifting antiresonance frequencies fa of series arm resonators s11 and s12 from each other.

Figure 5A:
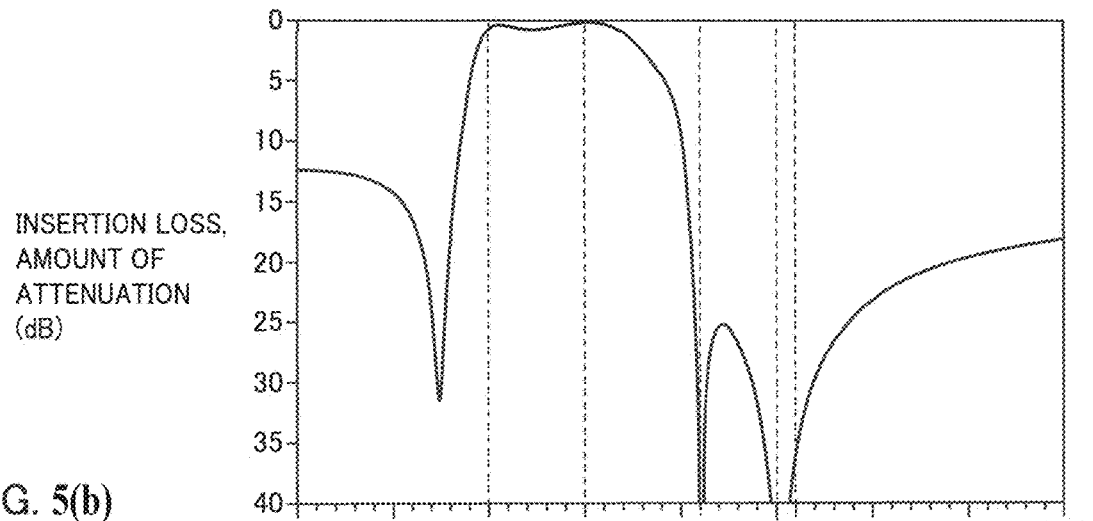
FIG. 5(a) and FIG. 5(b) are graphs that show a pass characteristic of the low band sided filter and impedance characteristics of resonators included in the low band sided filter in Embodiment 1.
Figure 5B:
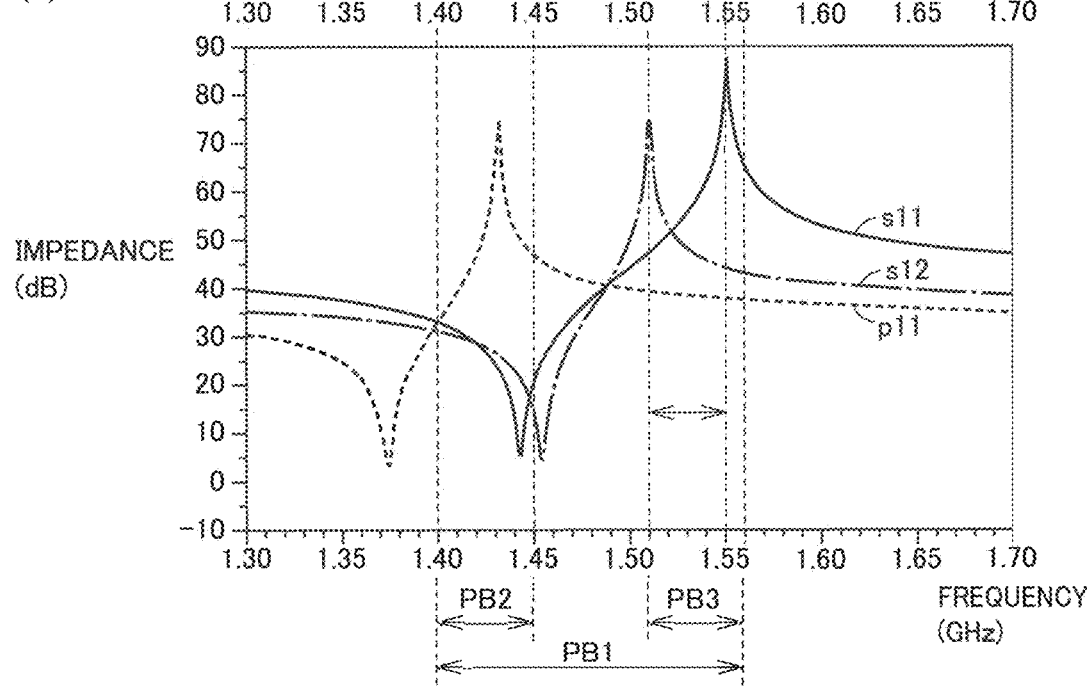

FIG. 5(a) and FIG. 5(b) respectively show a pass characteristic (a frequency characteristic of an insertion loss and an amount of attenuation) of low band sided filter FLT1 and impedance characteristics of resonators s11, s12, and p11 included in low band sided filter FLT1 in Embodiment 1. FIG. 5(a) shows the pass characteristic of low band sided filter FLT1 in Embodiment 1. FIG. 5(b) shows the impedance characteristics of series arm resonators s11 and s12 and parallel arm resonator p11 included in low band sided filter FLT1 in Embodiment 1. Herein, "a pass characteristic of a filter" refers to a pass characteristic of a filter alone, which is a pass characteristic when the filter is separated from any other circuit. "An impedance characteristic of a resonator" refers to an impedance characteristic of a resonator alone, which is an impedance characteristic when the resonator is separated from any other circuit.

Referring to FIG. 5 and Table 1, for the pass characteristic of filter FLT1, an attenuation pole occurs in the vicinity of the antiresonance frequency of each of series arm resonators s11 and s12 in the vicinity of passband PB3, as shown in FIG. 5(a). Since the antiresonance frequencies of series arm resonators s11 and s12 are shifted from each other by 40.8 MHz, the frequency bands in which an attenuation pole occurs also have a difference comparable to the difference in antiresonance frequency between series arm resonators s11 and s12.

Next, filter device 100 according to Comparative Example 1 will be described. Filter device 100 has the same circuit configuration as the circuit configuration shown in FIG. 4. Table 2 below shows resonance frequency fr, antiresonance frequency fa, fractional bandwidth BWR, and a capacitance of each of series arm resonators s11 and s12, parallel arm resonator p11, series arm resonator s21, and parallel arm resonators p21 and p22 in filter device 100.

TABLE 2

|  |  |  | fr [MHz] | fa [MHz] | BWR [%] | Capacitance [pF] |
|---|---|---|---|---|---|---|
| First filter FLT1 | Series arm resonator | s11 | 1456.4 | 1512.4 | 3.844 | 1.675 |
|  | Series arm resonator | s12 | 1455.9 | 1511.9 | 3.846 | 1.767 |
|  | Parallel arm resonator | p11 | 1374.9 | 1432.2 | 4.170 | 1.278 |
| Second filter FLT2 | Series arm resonator | s21 | 1522.9 | 1577.4 | 3.578 | 4.009 |
|  | Parallel arm resonator | p21 | 1455.5 | 1511.5 | 3.848 | 3.426 |
|  | Parallel arm resonator | p22 | 1455.5 | 1511.5 | 3.848 | 3.449 |

As shown in Table 2, in filter device 100, series arm resonators s11 and s12 have nearly equal resonance frequencies fr and nearly equal antiresonance frequencies fa, and accordingly, fractional bandwidth BWR of series arm resonator s11 is equal to fractional bandwidth BWR of series arm resonator s12.

Figure 6A:
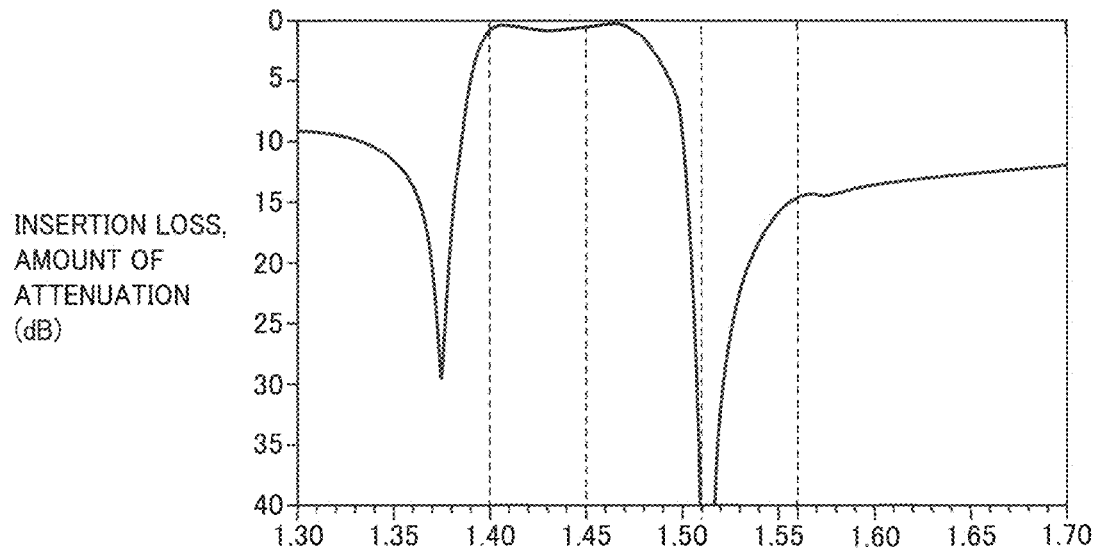
FIG. 6(a) and FIG. 6(b) are graphs that show a pass characteristic of a low band sided filter and impedance characteristics of resonators included in the low band sided filter in Comparative Example 1.
Figure 6B:
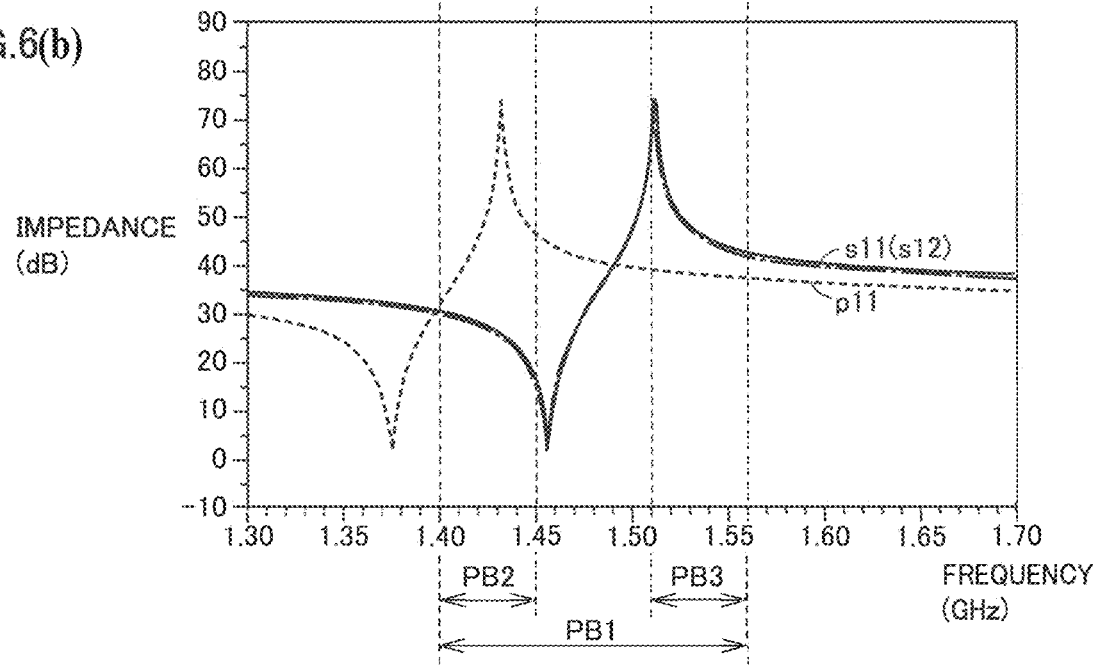

FIG. 6(a) and FIG. 6(b) respectively show a pass characteristic of low band sided filter FLT1 and impedance characteristics of resonators s11, s12, and p11 included in low band sided filter FLT1 in Comparative Example 1. FIG. 6(a) shows the pass characteristic of low band sided filter FLT1 in Comparative Example 1. FIG. 6(b) shows the impedance characteristics of series arm resonator s11 and s12 and parallel arm resonator p21 included in low band sided filter FLT1 in Comparative Example 1.

Referring to FIG. 6 and Table 2, for the pass characteristic of filter FLT1, an attenuation pole occurs in the vicinity of the antiresonance frequency of each of series arm resonators s11 and s12 in the vicinity of passband PB3, as shown in FIG. 6(a). Since series arm resonators s11 and s12 have nearly equal antiresonance frequencies, the attenuation poles concentrate on a frequency band narrower than that in Embodiment 1.

Figure 7A:
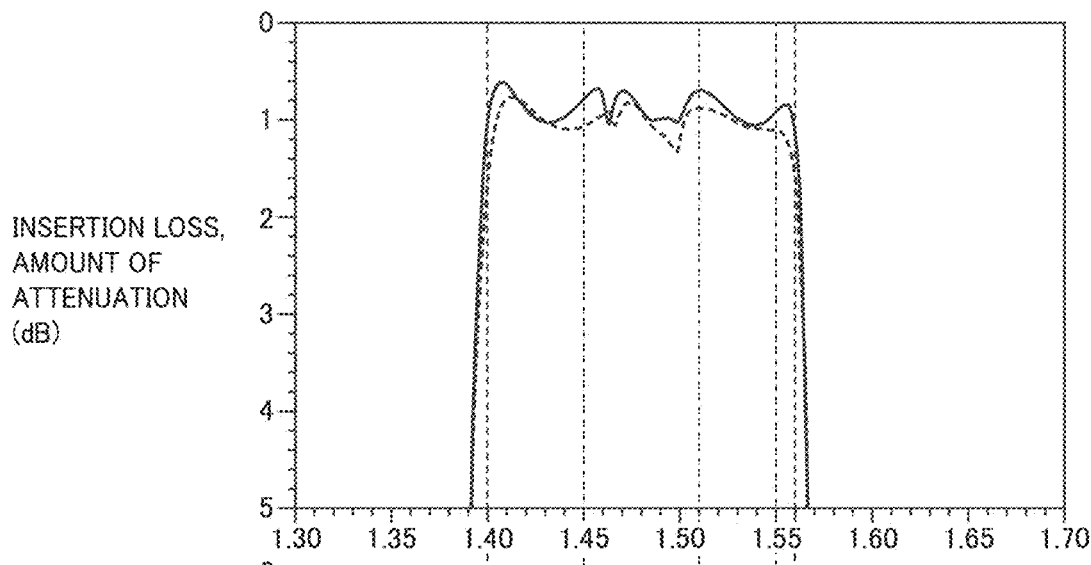
FIG. 7(a) and FIG. 7(b) are graphs that show pass characteristics of the filter devices and pass characteristic of the low band sided filters according to Embodiment 1 and Comparative Example 1.
Figure 7B:
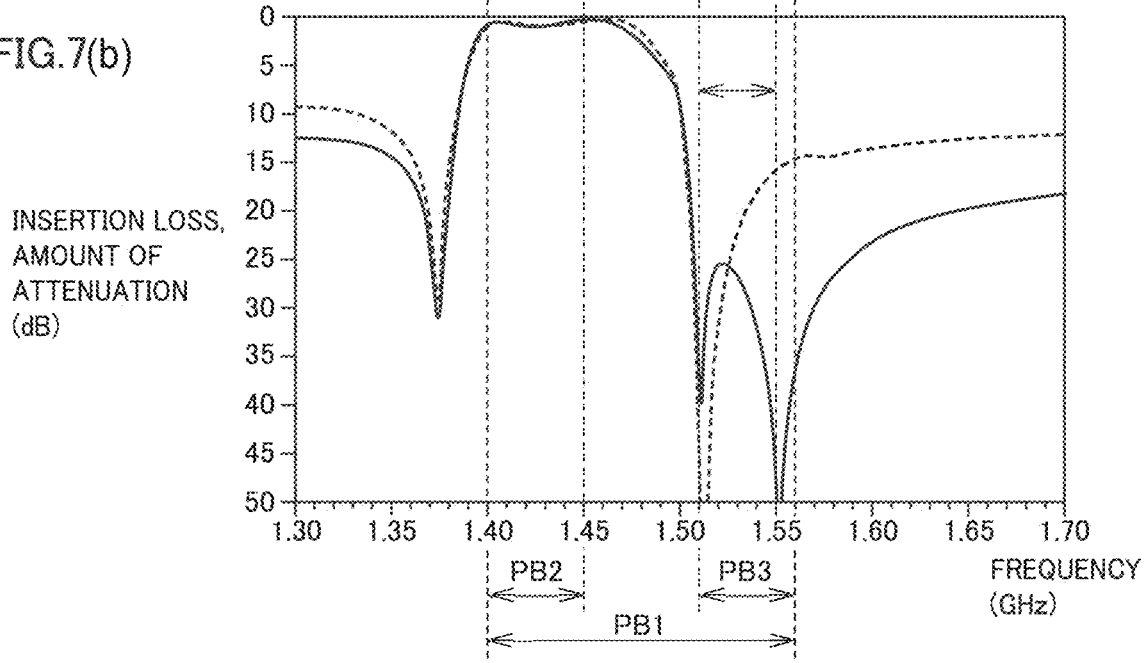

Next, Embodiment 1 is compared with Comparative Example 1. FIG. 7(a) and FIG. 7(b) respectively show pass characteristics of the filter devices and pass characteristic of the low band sided filters according to Embodiment 1 and Comparative Example 1. FIG. 7(a) shows the pass characteristic of filter device 1 (solid line) and the pass characteristic of filter device 100 (dotted line). FIG. 7(b) shows the pass characteristic of filter FLT1 in Embodiment 1 shown in FIG. 5(a) (solid line) and the pass characteristic of filter FLT1 in Comparative Example 1 shown in FIG. 6(a) (dotted line).

As shown in FIG. 7(b), in Embodiment 1, the frequency difference between two attenuation poles of filter FLT1, which are formed in the vicinity of passband PB3, is larger than that of Comparative Example 1, leading to a larger amount of attenuation in passband PB3. At the high band edge of passband PB1, thus, the insertion loss of filter device 1 is smaller than the insertion loss of filter device 100, as shown in FIG. 7(a).

Modification of Embodiment 1

Figure 8:
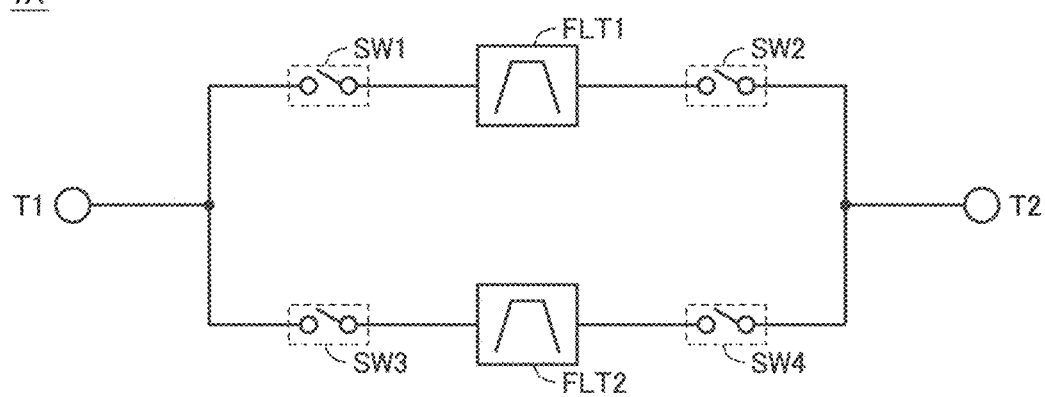
FIG. 8 is a circuit configuration diagram of a filter device according to a modification of Embodiment 1.

The filter device according to Embodiment 1 may have a variable passband. FIG. 8 is a circuit configuration diagram of a filter device 1A according to a modification of Embodiment 1. The components of filter device 1A include switches SW1 to SW4 in addition to the components of filter device 1 in FIG. 4. The other components are similar to those of filter device 1, description of which will not be repeated.

As shown in FIG. 8, switch SW1 (first switch) is connected between input-output terminal T1 and filter FLT1. Switch SW2 (second switch) is connected between input-output terminal T2 and filter FLT1. Switch SW3 (third switch) is connected between input-output terminal T1 and filter FLT2. Switch SW4 (fourth switch) is connected between input-output terminal T2 and filter FLT2. The conductive states (ON or OFF) of switches SW1 and SW2 are synchronous with each other. The conductive states of switches SW3 and SW4 are synchronous with each other.

The conductive states of switches SW1 to SW4 are switched in accordance with a control signal from a control circuit included in a radio frequency (RF) integrated circuit (RFIC), which is not shown. The control circuit may be provided separately from the RFIC.

When the conductive states of switches SW1 and SW2 are ON and the conductive states of switches SW3 and SW4 are OFF, the passband of filter device 1A is passband PB2 of filter FLT1. When the conductive states of switches SW1 and SW2 are OFF and the conductive states of switches SW3 and SW4 are ON, the passband of filter device 1A is passband PB3 of filter FLT2. When the conductive states of switches SW1 to SW4 are ON, the passband of filter device 1A is PB1.

Not all of switches SW1 to SW4 are required to allow the filter device according to Embodiment 1 to have a variable passband. For example, the filter device can have a variable passband by including any one of a combination of switches SW1 and SW2 and a combination of switches SW3 and SW4.

In the case where the filter device includes switches SW1 and SW2 and does not include switches SW3 and SW4, the passband of the filter device is PB1 when switches SW1 and SW2 are ON. When switches SW1 and SW2 are OFF, the passband of the filter device is passband PB3 of filter FLT2.

In the case where the filter device does not include switches SW1 and SW2 and includes witches SW3 and SW4, the passband of the filter device is PB1 when switches SW3 and SW4 are ON. When switches SW3 and SW4 are OFF, the passband of the filter device is passband PB2 of filter FLT1.

As described above, the filter devices according to Embodiment 1 and the modification can reduce an insertion loss of a passband.

Embodiment 2

Embodiment 2 will describe a case where multiple parallel arm resonators constituting a high band sided filter include two parallel arm resonators of different fractional bandwidths. Filter device 2 according to Embodiment 2 has the same circuit configuration as the circuit configuration shown in FIG. 4. In Embodiment 2, low band sided filter FLT1 may be an LC filter formed of an LC resonance circuit.

Table 3 below shows resonance frequency fr, antiresonance frequency fa, fractional bandwidth BWR, and a capacitance of each of series arm resonators s11 and s12, parallel arm resonator p11, series arm resonator s21, and parallel arm resonators p21 and p22 in filter device 2.

TABLE 3

|  |  |  | fr [MHz] | fa [MHz] | BWR [%] | Capacitance [pF] |
|---|---|---|---|---|---|---|
| First filter FLT1 | Series arm resonator | s11 | 1455.3 | 1511.3 | 3.849 | 2.641 |
|  | Series arm resonator | s12 | 1461.4 | 1517.3 | 3.824 | 1.113 |
|  | Parallel arm resonator | p11 | 1381.0 | 1438.3 | 4.146 | 1.463 |
| Second filter FLT2 | Series arm resonator | s21 | 1536.7 | 1590.8 | 3.523 | 1.898 |
|  | Parallel arm resonator | p21 | 1406.6 | 1515.2 | 7.724 | 7.634 |
|  | Parallel arm resonator | p22 | 1460.2 | 1516.1 | 3.829 | 0.688 |

As shown in Table 3, in filter device 2, a difference in antiresonance frequency fa between parallel arm resonators p21 and s22 is 0.9 MHz, whereas a difference in resonance frequency fr therebetween is 53.6 MHz. The difference in resonance frequency fr is about six times as large as the difference in antiresonance frequency fa. In filter device 2, fractional bandwidth BWR (fourth bandwidth) of parallel arm resonator p21 in filter device 2 is made larger than fractional bandwidth BWR (fifth bandwidth) of parallel arm resonator p22 by mainly shifting resonance frequencies fr of parallel arm resonator p21 (first parallel arm resonator) and parallel arm resonator p22 (second parallel arm resonator) from each other.

Figure 9A:
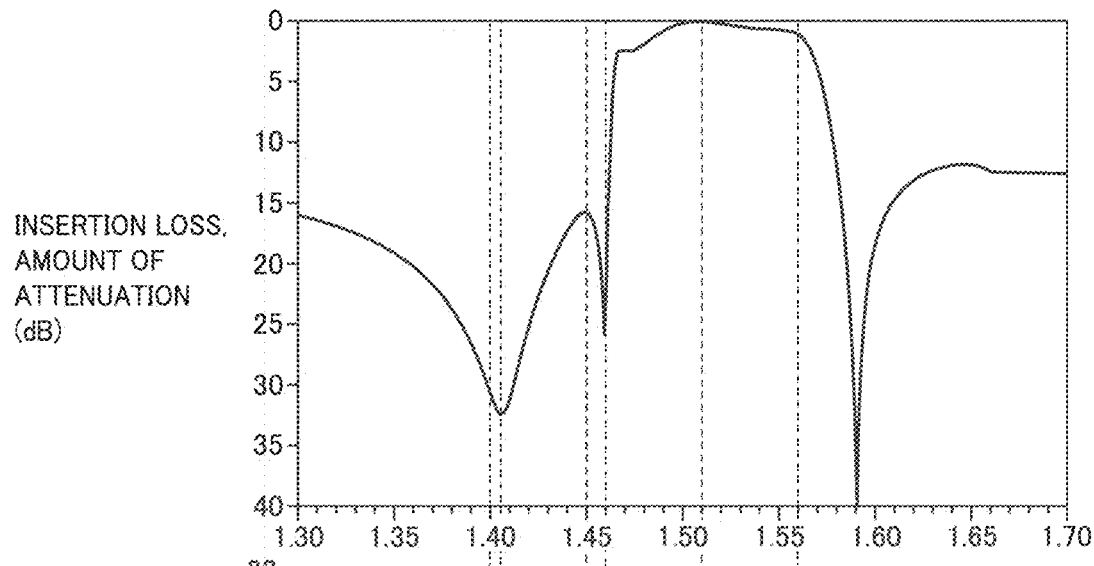
FIG. 9(a) and FIG. 9(b) are graphs that show a pass characteristic of a high band sided filter and impedance characteristics of resonators included in the high band sided filter in Embodiment 2.
Figure 9B:
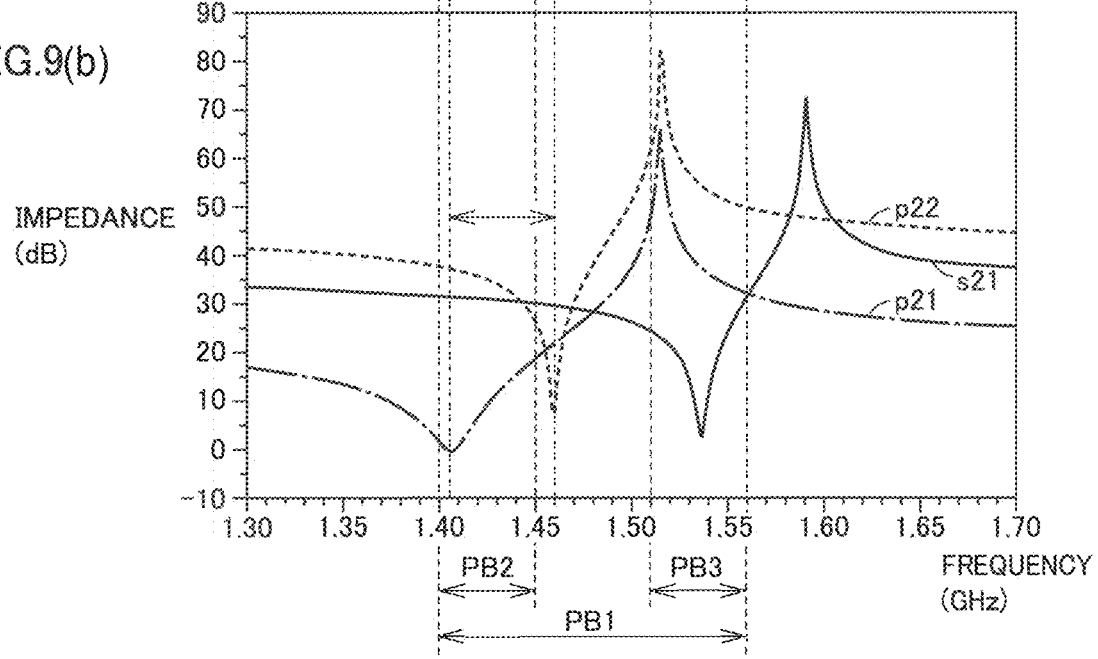

FIG. 9(a) and FIG. 9(b) respectively show a pass characteristic of high band sided filter FLT2 and impedance characteristics of resonators s21, s22, and p21 included in high band sided filter FLT2 in Embodiment 2. FIG. 9(a) shows the pass characteristic of high band sided filter FLT2 in Embodiment 2. FIG. 9(b) shows the impedance characteristics of series arm resonator s21 and parallel arm resonators p21 and p22 included in high band sided filter FLT2 in Embodiment 2.

Referring to FIG. 9(a) and Table 1, for the pass characteristic of filter FLT2, an attenuation pole occurs in the vicinity of the resonance frequency of each of parallel arm resonators p21 and p22 in the vicinity of passband PB2, as shown in FIG. 9(a). Since the antiresonance frequencies of parallel arm resonators p21 and p22 are shifted from each other by 53.6 MHz, the frequency bands in which an attenuation pole occurs have a difference comparable to a difference in resonance frequency between parallel arm resonators p21 and p22.

Referring again to Table 2, in filter device 100, parallel arm resonators p21 and p22 have nearly equal resonance frequencies fr and nearly equal antiresonance frequencies fa, and accordingly, fractional bandwidth BWR of parallel arm resonator p21 is equal to fractional bandwidth BWR of parallel arm resonator p22.

Figure 10A:
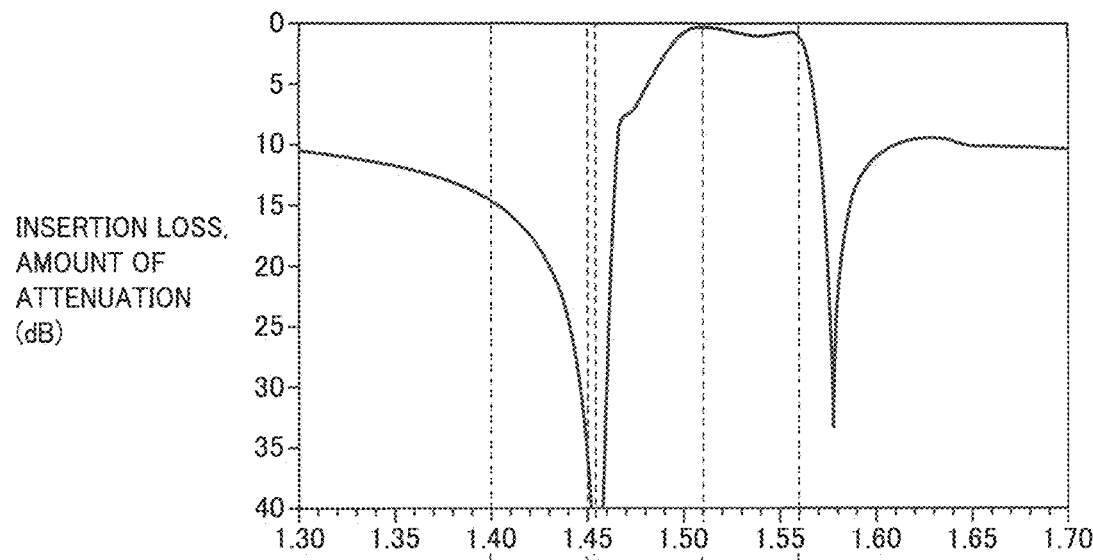
FIG. 10(a) and FIG. 10(b) are graphs that show a pass characteristic of a high band sided filter and impedance characteristics of resonators included in the high band sided filter in Comparative Example 1.
Figure 10B:
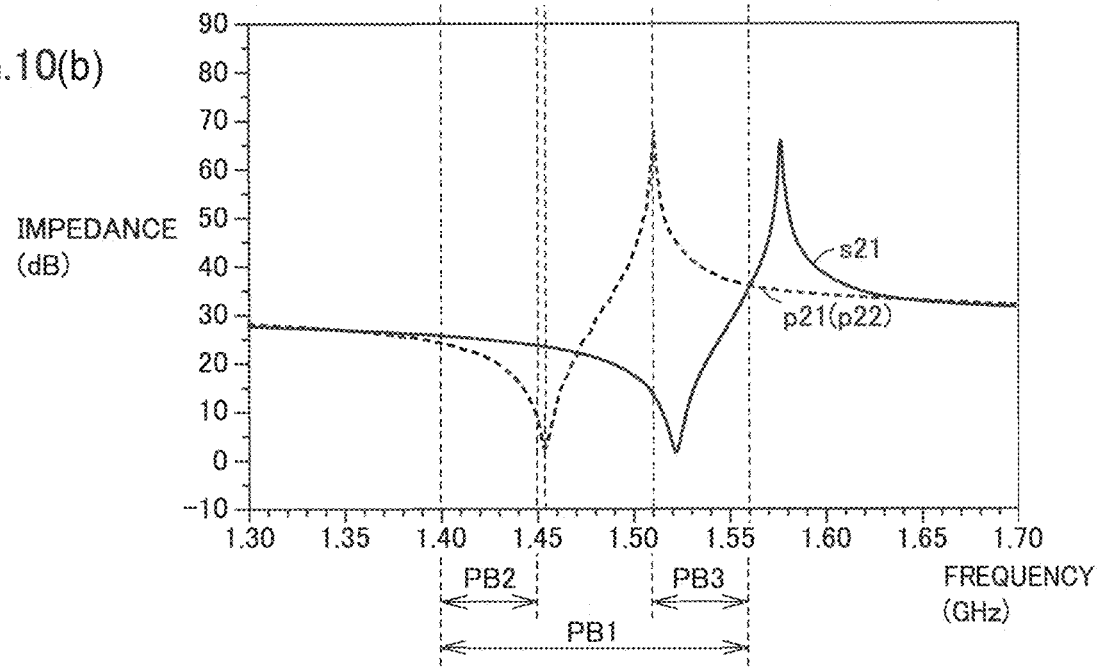

FIG. 10(*a*) and FIG. 10(*b*) respectively show a pass characteristic of high band sided filter FLT2 and impedance characteristics of resonators s21, p21, and p22 included in high band sided filter FLT2 in Comparative Example 1. FIG. 10(*a*) shows the pass characteristic of high band sided filter FLT2 in Comparative Example 1. FIG. 10(*b*) shows the impedance characteristics of series arm resonator s21 and parallel arm resonators p21 and p22 included in high band sided filter FLT2 in Comparative Example 1.

Referring to FIG. 10(*a*) and Table 2, for the pass characteristic of filter FLT2, an attenuation pole occurs in the vicinity of the resonance frequency of each of parallel arm resonators p21 and p22 on the low band sided side of passband PB1, as shown in FIG. 10(*a*). Since parallel arm resonators p21 and p22 have nearly equal resonance frequencies, attenuation poles concentrate on a frequency band narrower than that in Embodiment 2.

Figure 11A:
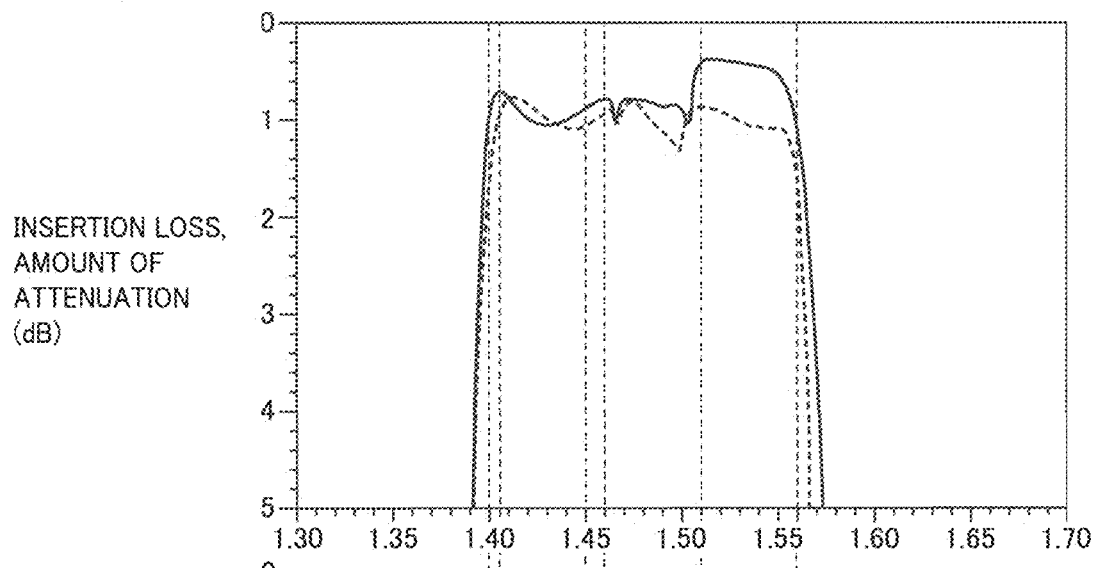
FIG. 11(a) and FIG. 11(b) are graphs that show pass characteristics of the filter devices and pass characteristics of the high band sided filters according to Embodiment 2 and Comparative Example 1.
Figure 11B:
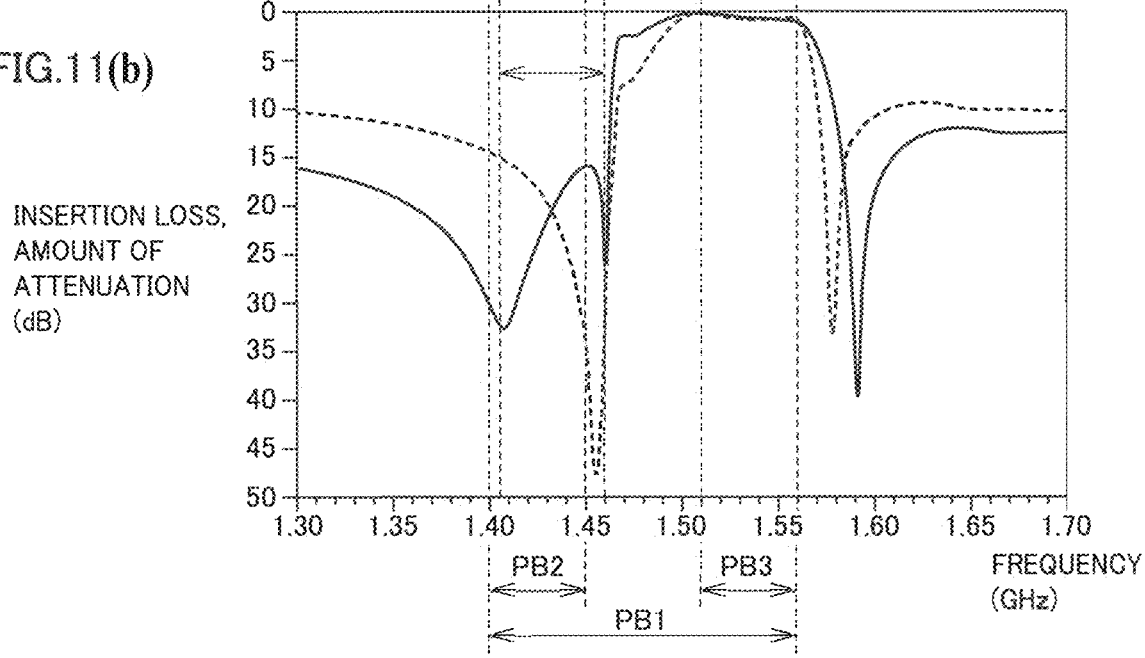

Next, Embodiment 2 is compared with Comparative Example 1. FIG. 11(*a*) and FIG. 11(*b*) respectively show the pass characteristics of the filter devices and the pass characteristics of the high band sided filters according to Embodiment 2 and Comparative Example 1. FIG. 11(*a*) shows the pass characteristic of filter device 2 (solid line) and the pass characteristic of filter device 100 (dotted line). FIG. 11(*b*) shows the pass characteristic of filter FLT2 in Embodiment 2 which is shown in FIG. 9(*a*) (solid line) and the pass characteristic of filter FLT2 in Comparative Example 1 shown in FIG. 10(*a*) (dotted line).

As shown in FIG. 11(*b*), in Embodiment 2, the frequency difference between two attenuation poles of filter FLT2, which are formed on the low band sided side in the vicinity of passband PB2, is larger than that of Comparative Example 1, leading to a larger amount of attenuation in passband PB2. Thus, at the low band edge of passband PB1, the insertion loss of filter device 2 is smaller than the insertion loss of filter device 100, as shown in FIG. 11(*a*).

As described above, the filter device according to Embodiment 2 can reduce an insertion loss of a passband.

Embodiments 3 and 4

For the elastic wave resonator, a frequency at a high band edge of a stop band of the elastic wave resonator occurs at a frequency higher than an antiresonance frequency, and at a frequency higher than the frequency at the high band edge of the stop band, a reflection coefficient of the elastic wave resonator is smaller than the reflection coefficient at antiresonance frequency fa. This is because a reflection loss increases as a bulk wave in the elastic wave resonator leaks out of the elastic wave resonator (this is referred to as a "bulk wave loss"), resulting in deteriorated Q characteristics of the elastic wave resonator.

As an antiresonance frequency is higher, a frequency at which a bulk wave loss occurs can be higher. In other words, by increasing the fractional bandwidth of the elastic wave resonator, a difference between antiresonance frequency and resonance frequency can be increased, and also, a difference between a resonance frequency and a frequency (frequency at a high band edge of a stop band) at which a bulk wave loss occurs can be increased.

Thus, as a bulk wave loss increases in the low band sided filter, the insertion loss of the passband of the high band sided filter increases, leading to an increased insertion loss in the passband of the filter device. Further, the resonator closest to the input-output terminal of the low band sided filter has a relatively low impedance in the low band sided filter in the passband of the high band sided filter, which greatly affects the passband insertion loss of the filter device.

Considering the above, Embodiments 3 and 4 focus on resonators closest to the input-output terminals. First, Embodiment 3 will describe a case where fractional bandwidths of series arm resonators closest to the input-output terminals (series arm resonators at the opposite ends) are smaller than the fractional bandwidths of series arm resonators disposed between the series arm resonators at the opposite ends, and then, indicate that the effects of the present disclosure can be achieved. Then, Embodiment 4 will describe a case where the fractional bandwidths of the series arm resonators at the opposite ends are larger than the fractional bandwidths of the series arm resonators disposed between the series arm resonators at the opposite ends, and then, indicate that Embodiment 4 is more effective than Embodiment 3 in terms of reducing a bulk wave loss.

Embodiment 3

Figure 12:
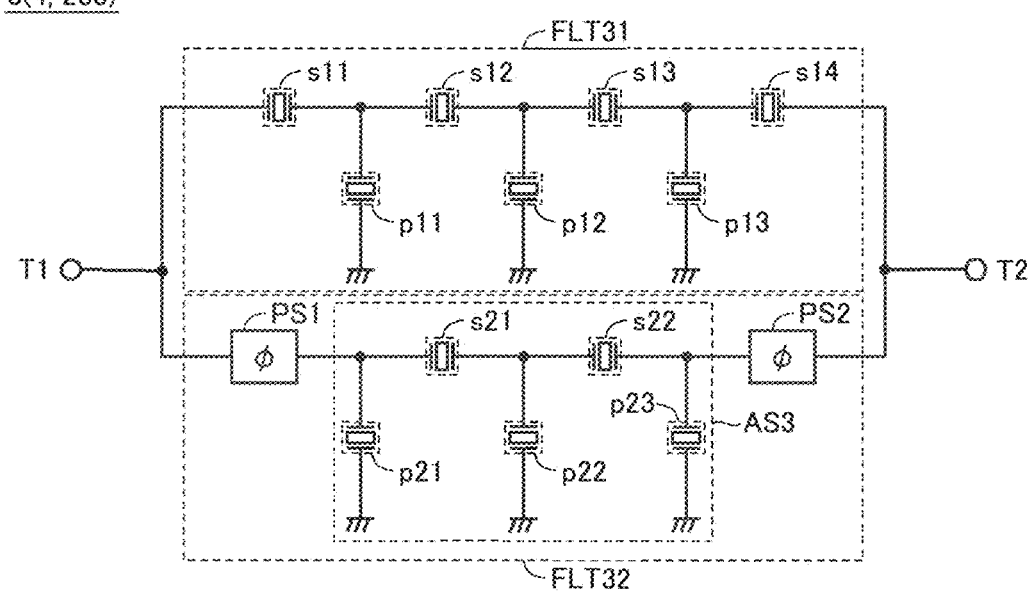
FIG. 12 is a circuit configuration diagram of a filter device according to Embodiment 3.

FIG. 12 is a circuit configuration diagram of a filter device 3 according to Embodiment 3. The configuration of filter device 3 is obtained by replacing filters FLT1 and FLT2 in FIG. 4 with filters FLT 31 and FLT32, respectively. A filter device 200 according to Comparative Example 2 and a filter device 4 according to Embodiment 4, which will be referred to below, have the same circuit configuration as the circuit configuration shown in FIG. 12.

As shown in FIG. 12, filter FLT 31 further includes a series arm resonator s13 (second series arm resonator), a series arm resonator s14 (third series arm resonator), and parallel arm resonators p12 and p13 in addition to the components of filter FLT1 in FIG. 4.

Series arm resonators s11 to s14 are connected in series with each other between input-output terminals T1 and T2 with series arm resonators s11 and s14 located at the opposite ends. Among series arm resonators s11 to s14, series arm resonator s11 is closest to input-output terminal T1, and series arm resonator s14 is closest to input-output terminal T2.

Parallel arm resonator p12 is connected between a grounding point and a connecting point between series arm resonators s12 and s13. Parallel arm resonator p13 is connected between the grounding point and a connecting point between series arm resonators s13 and s14.

Filter FLT32 includes a filter circuit AS3 in place of filter circuit AS1 in FIG. 4. Filter circuit AS3 further includes a series arm resonator s22 and a parallel arm resonator p23 in addition to the components of filter circuit AS1.

Series arm resonators s21 and s22 are connected in series with each other between phase shifters PS1 and PS2. Parallel arm resonator p22 is connected between the grounding point and a connecting point between series arm resonators s21 and s22. Parallel arm resonator p23 is connected between the grounding point and a connecting point between phase shifter PS2 and series arm resonator s22.

Table 4 below shows resonance frequency fr, antiresonance frequency fa, fractional bandwidth BWR, and a capacitance of each of series arm resonators s11 to s14, parallel arm resonators p11 to p13, series arm resonators s21 and s22, and parallel arm resonators p21 to p23 in filter device 3. As shown in Table 4, fractional bandwidth BWR (first bandwidth) of series arm resonator s11 and fractional bandwidth BWR (third bandwidth) of series arm resonator s14 in filter device 3 are smaller than fractional bandwidths BWR (second bandwidths) of series arm resonators s12 and s13.

TABLE 4

| | | | fr [MHz] | fa [MHz] | BWR [%] | Capacitance [pF] |
|---|---|---|---|---|---|---|
| First filter FLT 31 | Series arm resonator | s11 | 1450.8 | 1506.9 | 3.867 | 9.123 |
| | Series arm resonator | s12 | 1453.3 | 1560.8 | 7.397 | 0.878 |
| | Series arm resonator | s13 | 1451.5 | 1559.0 | 7.410 | 0.867 |
| | Series arm resonator | s14 | 1459.7 | 1515.6 | 3.831 | 8.363 |
| | Parallel arm resonator | p11 | 1379.8 | 1437.1 | 4.151 | 1.413 |
| | Parallel arm resonator | p12 | 1379.6 | 1436.9 | 4.152 | 2.318 |
| | Parallel arm resonator | p13 | 1380.5 | 1437.8 | 4.148 | 1.357 |
| Second filter FLT32 | Series arm resonator | s21 | 1520.8 | 1575.3 | 3.587 | 5.051 |
| | Series arm resonator | s22 | 1520.9 | 1575.4 | 3.586 | 4.220 |
| | Parallel arm resonator | p21 | 1453.8 | 1509.8 | 3.855 | 2.086 |
| | Parallel arm resonator | p22 | 1455.9 | 1511.9 | 3.846 | 3.304 |
| | Parallel arm resonator | p23 | 1456.5 | 1512.5 | 3.844 | 2.935 |

Table 5 below shows resonance frequency fr, antiresonance frequency fa, fractional bandwidth BWR, and a capacitance of each of series arm resonators s11 to s14, parallel arm resonators p11 to p13, series arm resonators s21 and s22, and parallel arm resonators p21 to p23 in filter device 200 according to Comparative Example 2. As shown in Table 5, series arm resonators s11 to s14 in filter device 200 have an equal fractional bandwidth.

TABLE 5

| | | | fr [MHz] | fa [MHz] | BWR [%] | Capacitance [pF] |
|---|---|---|---|---|---|---|
| First filter FLT 31 | Series arm resonator | s11 | 1461.5 | 1517.4 | 3.824 | 9.984 |
| | Series arm resonator | s12 | 1461.6 | 1517.5 | 3.824 | 1.833 |
| | Series arm resonator | s13 | 1462.1 | 1518.0 | 3.822 | 1.853 |
| | Series arm resonator | s14 | 1453.9 | 1509.9 | 3.854 | 9.997 |
| | Parallel arm resonator | p11 | 1381.7 | 1438.9 | 4.143 | 1.477 |
| | Parallel arm resonator | p12 | 1383.9 | 1441.1 | 4.134 | 1.893 |
| | Parallel arm resonator | p13 | 1381.7 | 1438.9 | 4.143 | 1.458 |
| Second filter FLT32 | Series arm resonator | s21 | 1520.0 | 1574.6 | 3.590 | 3.251 |
| | Series arm resonator | s22 | 1520.0 | 1574.6 | 3.590 | 3.305 |
| | Parallel arm resonator | p21 | 1455.7 | 1511.7 | 3.847 | 2.729 |
| | Parallel arm resonator | p22 | 1451.7 | 1507.8 | 3.863 | 3.845 |
| | Parallel arm resonator | p23 | 1455.9 | 1511.9 | 3.846 | 2.714 |

Figure 13A:
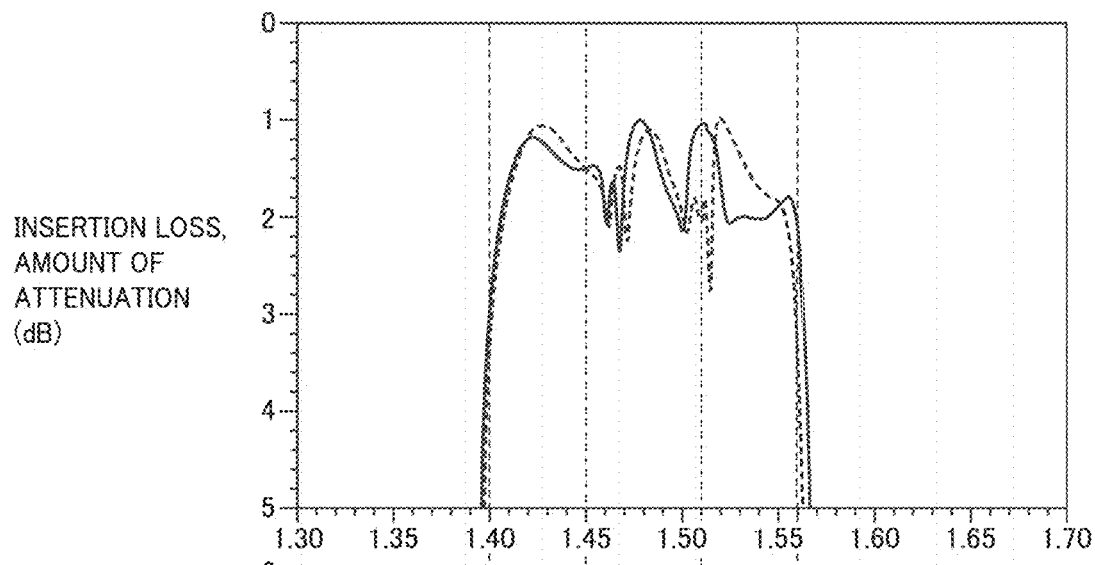
FIG. 13(a) and FIG. 13(b) are graphs that show pass characteristics of filter devices and pass characteristics of low band sided filters according to Embodiment 3 and Comparative Example 2.
Figure 13B:
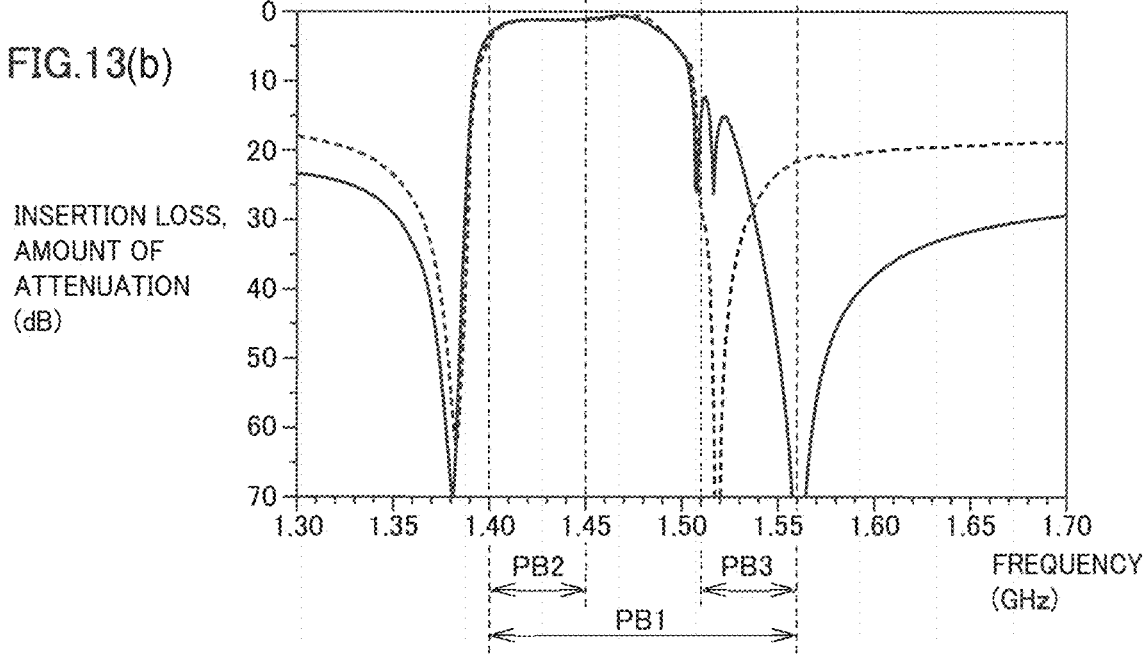

Next, Embodiment 3 is compared with Comparative Example 2. FIG. 13(a) and FIG. 13(b) respectively show pass characteristics of the filter devices and pass characteristics of the low band sided filters according to Embodiment 3 and Comparative Example 2. FIG. 13(a) shows the pass characteristic of filter device 3 (solid line) and the pass characteristic of filter device 200 (dotted line). FIG. 13(b) shows the pass characteristic of filter FLT 31 in Embodiment 3 (solid line) and the pass characteristic of filter FLT 31 in Comparative Example 2 (dotted line).

As shown in FIG. 13(b), in Embodiment 3, a frequency difference between the attenuation pole at the highest frequency and the attenuation pole at the lowest frequency of filter FLT 31, which are formed on the high band sided side of passband PB1, is larger than that of Comparative Example 2, leading to a larger amount of attenuation at the high band edge of passband PB3. At the high band sided filter of passband PB1, thus, the insertion loss of filter device 3 is smaller than the insertion loss of filter device 200, as shown in FIG. 13(a).

As described above, the filter device according to Embodiment 3 can reduce an insertion loss of a passband.

Embodiment 4

Table 6 below shows resonance frequency fr, antiresonance frequency fa, fractional bandwidth BWR, and a capacitance of each of series arm resonators s11 to s14, parallel arm resonators p11 to p13, series arm resonators s21 and s22, and parallel arm resonators p21 to p23 in filter device 4. As shown in Table 6, fractional bandwidth BWR (first bandwidth) of series arm resonator s11 and fractional bandwidth BWR (third bandwidth) of series arm resonator s14 in filter device 4 are larger than fractional bandwidths BWR (second bandwidths) of series arm resonators s12 and s13. The capacitance of series arm resonator s14 is smaller than the capacitance of each of series arm resonators s11 to s13.

TABLE 6

| | | | fr [MHz] | fa [MHz] | BWR [%] | Capacitance [pF] |
|---|---|---|---|---|---|---|
| First filter FLT 31 | Series arm resonator | s11 | 1401.2 | 1510.0 | <u>7.762</u> | 9.844 |
| | Series arm resonator | s12 | 1473.9 | 1529.5 | 3.774 | 2.195 |
| | Series arm resonator | s13 | 1473.9 | 1529.5 | 3.774 | 2.397 |
| | Series arm resonator | s14 | 1444.8 | 1552.5 | <u>7.456</u> | <u>1.045</u> |
| | Parallel arm resonator | p11 | 1378.8 | 1436.1 | 4.155 | 1.828 |
| | Parallel arm resonator | p12 | 1383.8 | 1441.0 | 4.135 | 1.075 |

TABLE 6-continued

|  |  |  | fr [MHz] | fa [MHz] | BWR [%] | Capacitance [pF] |
|---|---|---|---|---|---|---|
| | Parallel arm resonator | p13 | 1382.0 | 1439.2 | 4.142 | 1.530 |
| Second filter FLT32 | Series arm resonator | s21 | 1519.8 | 1574.4 | 3.591 | 3.703 |
| | Series arm resonator | s22 | 1520.3 | 1574.9 | 3.589 | 4.18 |
| | Parallel arm resonator | p21 | 1455.9 | 1511.9 | 3.846 | 3.205 |
| | Parallel arm resonator | p22 | 1454.8 | 1510.8 | 3.851 | 3.837 |
| | Parallel arm resonator | p23 | 1456.3 | 1512.3 | 3.845 | 1.909 |

Figure 14A:
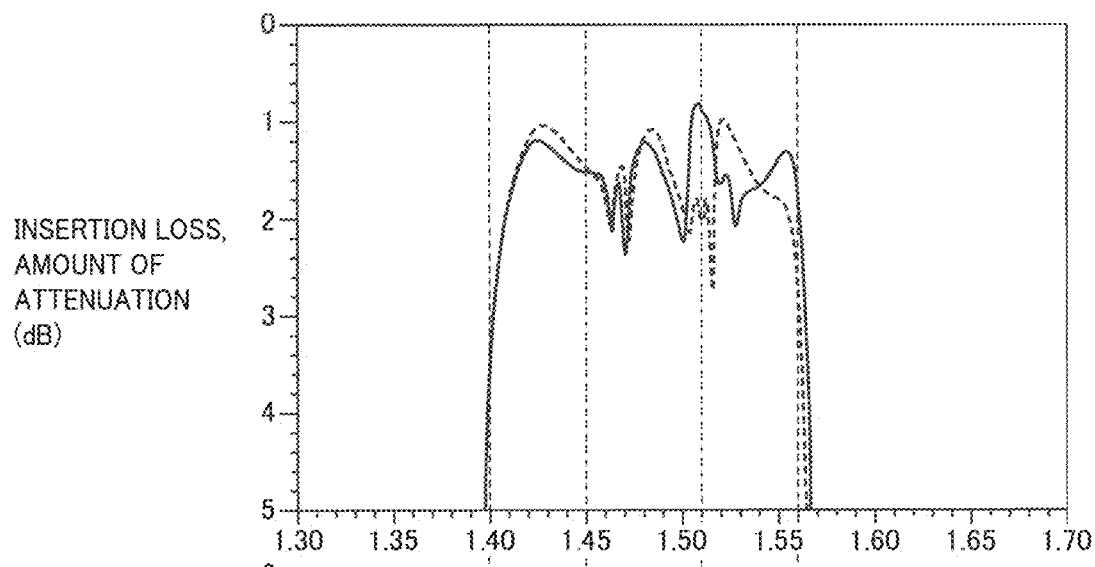
FIG. 14(a) and FIG. 14(b) are graphs that show pass characteristics of filter devices and pass characteristics of low band sided filters according to Embodiment 4 and Comparative Example 2.
Figure 14B:
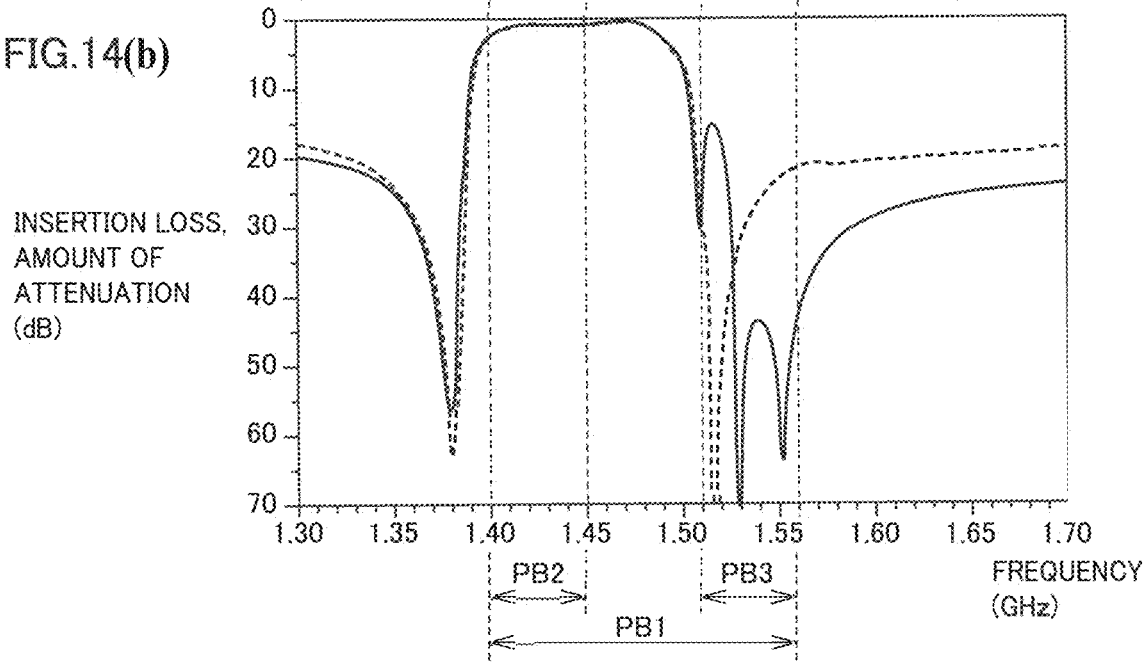

Next, Embodiment 4 is compared with Comparative Example 2. FIG. 14(a) and FIG. 14(b) respectively show pass characteristics of the filter devices and pass characteristics of the low band sided filters according to Embodiment 4 and Comparative Example 2. FIG. 14(a) shows the pass characteristic of filter device 4 (solid line) and the pass characteristic of filter device 200 (dotted line). FIG. 14(b) shows the pass characteristic of filter FLT 31 in Embodiment 4 (solid line) and the pass characteristic of filter FLT 31 in Comparative Example 2 (dotted line).

As shown in FIG. 14(b), in Embodiment 4, a frequency difference between the attenuation pole of the highest frequency and the attenuation pole of the lowest frequency of filter FLT 31, which are formed on the high band sided side of passband PB1, is larger than that of Comparative Example 2, leading to a larger amount of attenuation at the high band edge of passband PB3. At the high band edge of passband PB1, thus, the insertion loss of filter device 4 is smaller than the insertion loss of filter device 200, as shown in FIG. 14(a).

Figure 15A:
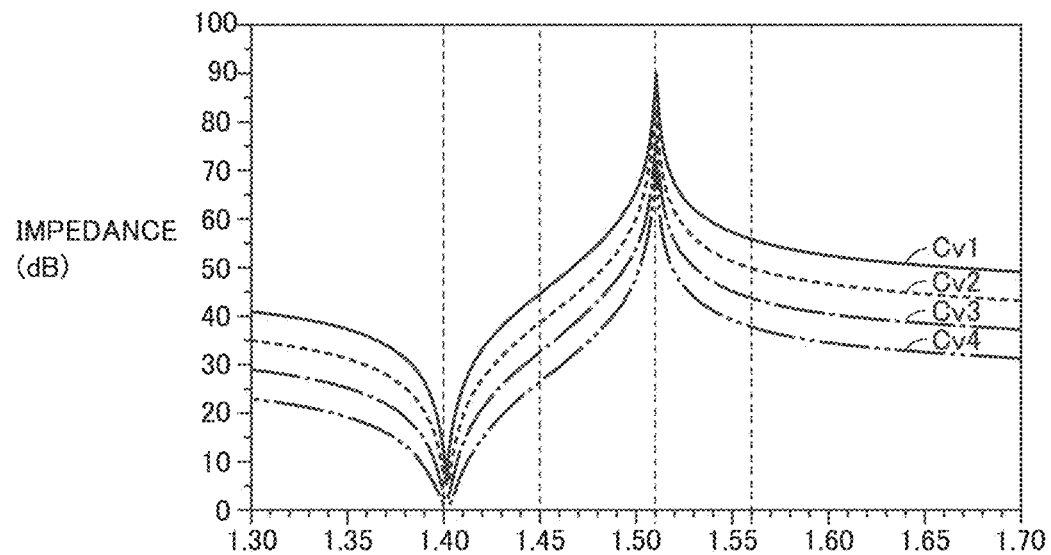
FIG. 15(a) and FIG. 15(b) are graphs that show changes in impedance characteristic and reflection characteristic of an elastic wave resonator when the capacitance of the elastic wave resonator is changed.
Figure 15B:
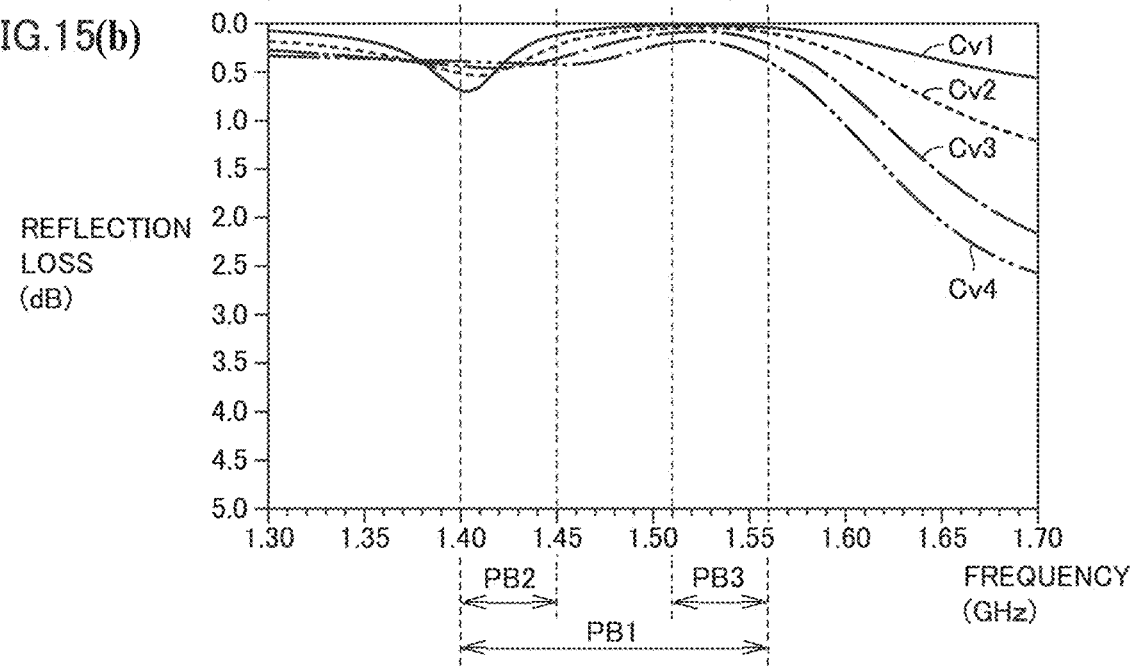

Next, Embodiment 3 is compared with Embodiment 4 with reference to FIGS. 15(a)/(b) to 19(a)/(b). First, a typical relation among the capacitance, impedance, and reflection loss of an elastic wave resonator will be described with reference to FIG. 15(a) and FIG. 15(b). FIG. 15(a) shows changes in the impedance characteristics and FIG. 15(b) shows reflection characteristics (frequency characteristics of a reflection loss) of an elastic wave resonator when the capacitance of the elastic wave resonator is changed from Cv1 to Cv4 (Cv1<Cv2<Cv3<Cv4). Herein, "an impedance characteristic of a resonator" and "a reflection characteristics of a resonator" refer to an impedance characteristic and a reflection characteristic of a resonator alone, which are an impedance characteristic and a reflection characteristics when the resonator is separated from any other circuit.

As shown in FIG. 15(a), impedance is higher as the capacitance of an elastic wave resonator is smaller. As shown in FIG. 15(b), a reflection loss in a frequency band higher than the antiresonance frequency of the elastic wave resonator is smaller as the capacitance of the elastic wave resonator is smaller. Thus, the capacitance of a resonator closest to the input-output terminal is desirably smaller.

Figure 16A:
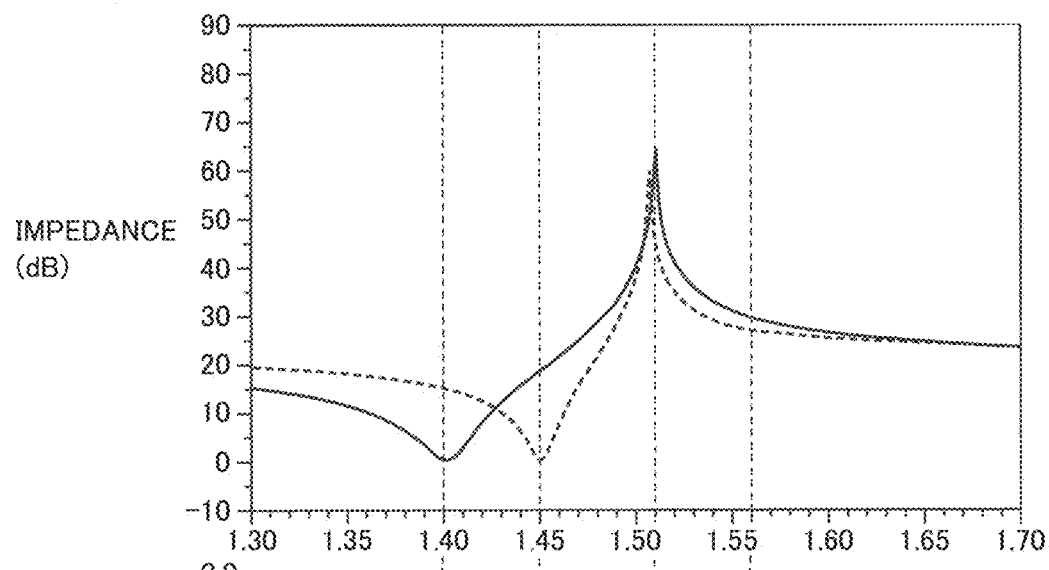
FIG. 16(a) and FIG. 16(b) are graphs that show impedance characteristics and reflection characteristics of series arm resonators of Embodiments 3 and 4.
Figure 16B:
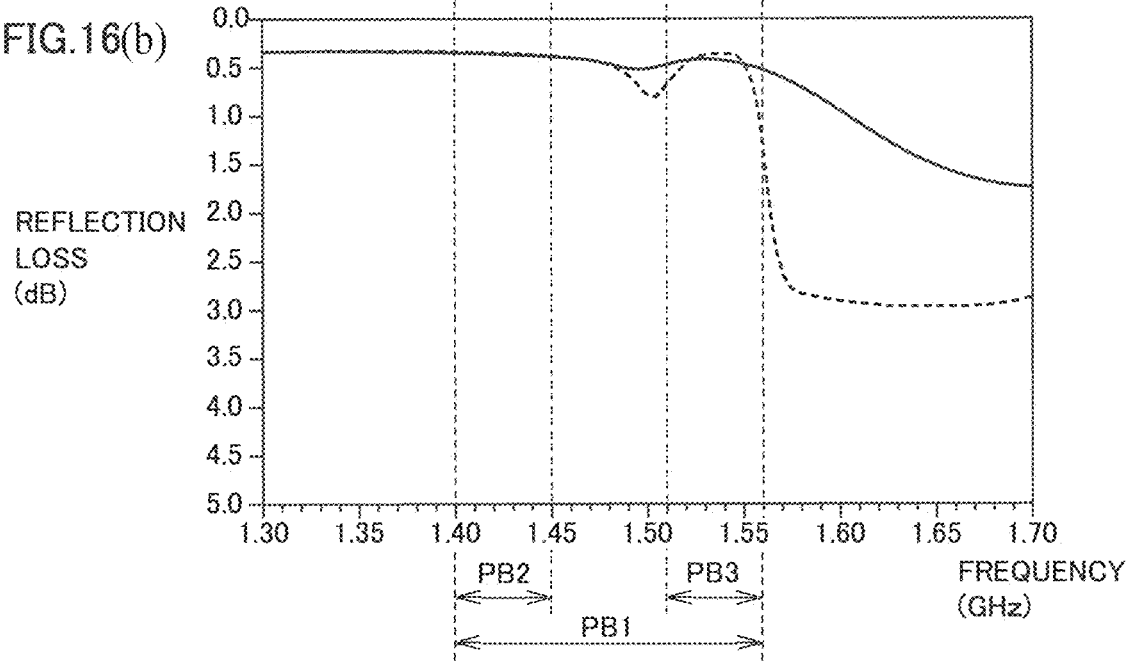

FIG. 16(a) shows impedance characteristics and FIG. 16(b) shows reflection characteristics of series arm resonators s11 in Embodiments 3 and 4. FIG. 16(a) shows the impedance characteristic of series arm resonator s11 in Embodiment 3 (dotted line) and the impedance characteristic of series arm resonator s11 in Embodiment 4 (solid line). FIG. 16(b) shows the reflection characteristic of series arm resonator s11 in Embodiment 3 (dotted line) and the reflection characteristic of series arm resonator s11 in Embodiment 4 (solid line).

As shown in FIG. 16(a), the impedance of series arm resonator s11 at the high band edge of passband PB1 is higher in Embodiment 4 than in Embodiment 3. As shown in FIG. 16(b), the reflection loss of series arm resonator s11 at the high band edge of passband PB1 is smaller in Embodiment 4 than in Embodiment 3.

Figure 17A:
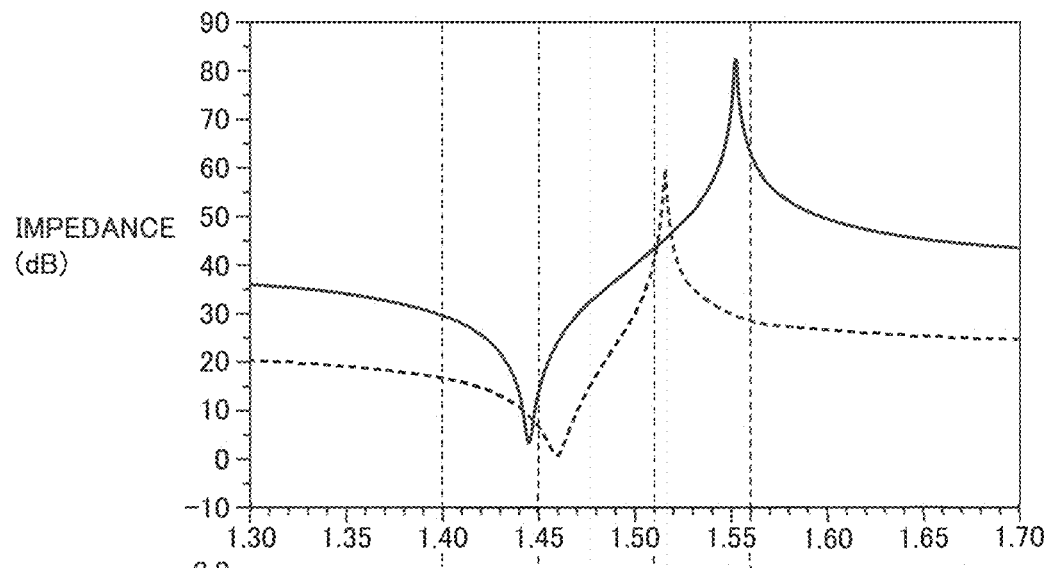
FIG. 17(a) and FIG. 17(b) are graphs that show impedance characteristics and reflection characteristics of the series arm resonators of Embodiments 3 and 4.
Figure 17B:
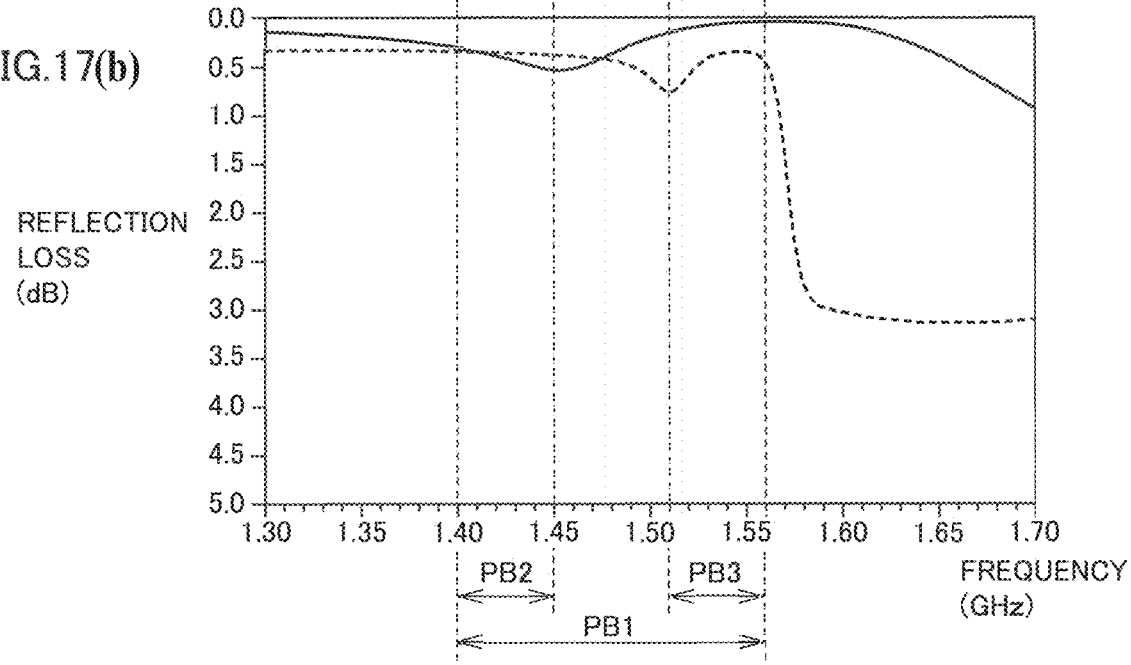

FIG. 17(a) shows impedance characteristics and FIG. 17(b) shows reflection characteristics of series arm resonators s14 of Embodiments 3 and 4. FIG. 17(a) shows the impedance characteristic of series arm resonator s14 in Embodiment 3 (dotted line) and the impedance characteristic of series arm resonator s14 in Embodiment 4 (solid line). FIG. 17(b) shows the reflection characteristics of series arm resonator s14 in Embodiment 3 (dotted line) and the reflection characteristic of series arm resonator s14 in Embodiment 4 (solid line).

As shown in FIG. 17(a), the impedance of series arm resonator s14 at the high band edge of passband PB1 is higher in Embodiment 4 than in Embodiment 3. As shown in FIG. 17(b), the reflection loss of series arm resonator s14 at the high band edge of passband PB1 is smaller in Embodiment 4 than in Embodiment 3.

As shown in Table 4, in Embodiment 3, the fractional bandwidth of series arm resonator s11 and the fractional bandwidth of series arm resonator s14 are smaller than the fractional bandwidth of series arm resonator s12 and the fractional bandwidth of series arm resonator s13. In Embodiment 3, also, the capacitance of series arm resonator s11 and the capacitance of series arm resonator s14 are larger than the capacitance of series arm resonator s12 and the capacitance of series arm resonator s13.

As shown in Table 5, in Embodiment 4, the fractional bandwidth of series arm resonator s11 and the fractional bandwidth of series arm resonator s14 are larger than the fractional bandwidth of series arm resonator s12 and the fractional bandwidth of series arm resonator s13. Also, at least any one (herein, series arm resonator s14) of the capacitance of series arm resonator s11 and the capacitance of series arm resonator s14 is smaller than the capacitance of series arm resonator s12 and the capacitance of series arm resonator s13.

As shown in FIGS. 16(a)/(b) to 17(a)/(b), the resonance frequencies of series arm resonators s11 to s14 are set in the frequency band within or in the vicinity of passband PB2. Further, in a series arm resonator with a small fractional bandwidth, a reflection loss due to a bulk wave loss is large, and a difference between the resonance frequency and a frequency at which a bulk wave loss occurs is small, and accordingly, a reflection loss at the high band edge of the passband of the filter device is large. In contrast, in a series arm resonator with a large fractional bandwidth, a reflection loss due to a bulk wave loss is small, and a difference between the resonance frequency and a frequency at which a bulk wave loss occurs is large, and accordingly, a reflection loss at the high band edge of the passband of the filter device is small. In comparison of the series arm resonators of the same fractional bandwidth, a reflection loss due to a bulk wave loss is smaller in a series arm resonator with a smaller capacitance.

Figure 18A:
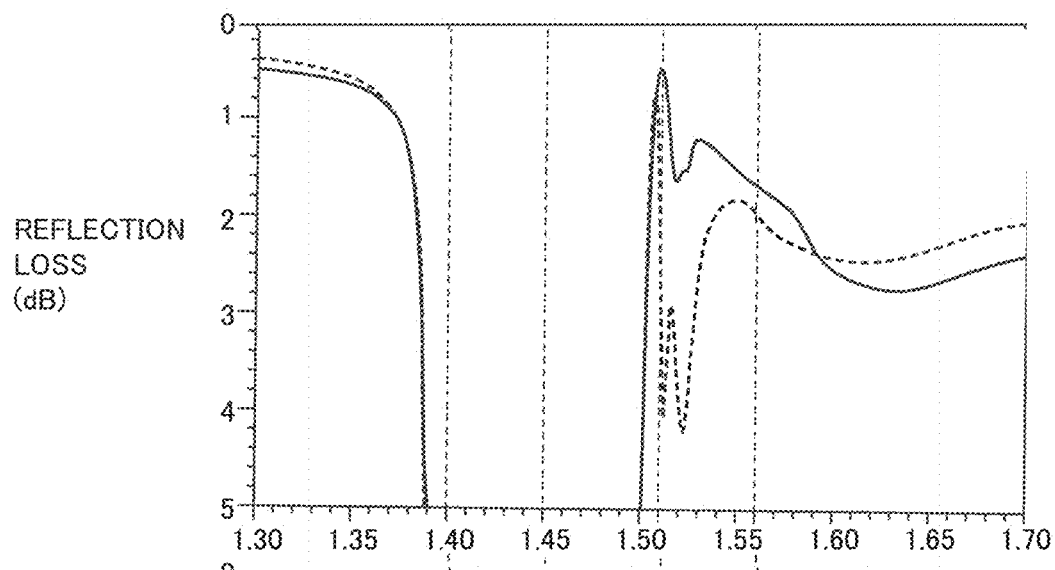
FIG. 18(a) and FIG. 18(b) are graphs that show reflection characteristics of the low band sided filter of Embodiment 3 and reflection characteristics of the low band sided filter of Embodiment 4.
Figure 18B:
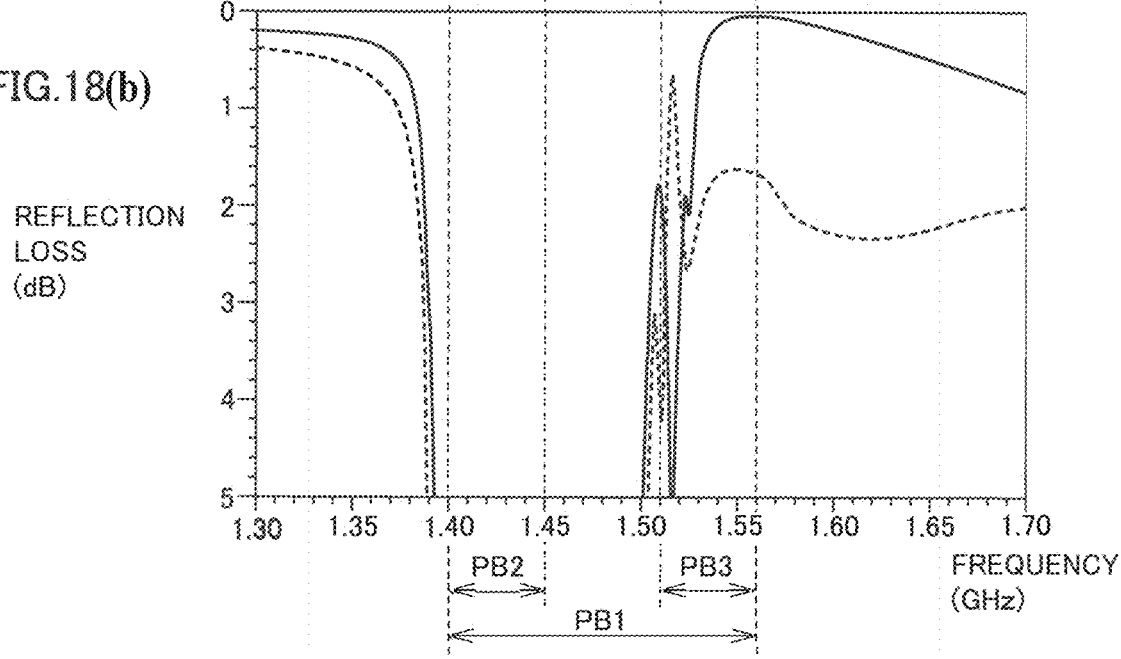

FIG. 18(a) and FIG. 18(b) respectively show reflection characteristics of low band sided filter FLT 31 in Embodiment 3 (dotted line) and reflection characteristics of low band sided filter FLT 31 in Embodiment 4 (solid line). FIG. 18(a) shows the reflection characteristics of low band sided filter FLT 31 at input-output terminal T1. FIG. 18(b) shows the reflection characteristics of low band sided filter FLT 31 at input-output terminal T2. As shown in FIG. 18, a reflection loss of filter FLT 31 at the high band edge of passband PB1 is smaller at any input-output terminal of input-output terminals T1 and T2 in Embodiment 4 than in Embodiment 3.

A series arm resonator closest to the input-output terminal among series arm resonators s11 to s14 has a relatively low impedance in low band sided filter FLT 31 in the passband of the high band sided filter, which greatly affects the insertion loss in the passband of the filter device. At the high band edge of passband PB1, accordingly, a reflection loss of low band sided filter FLT 31 is smaller in Embodiment 4 in which the reflection losses of series arm resonator s11 and series arm resonator s14 are smaller.

Figure 19A:
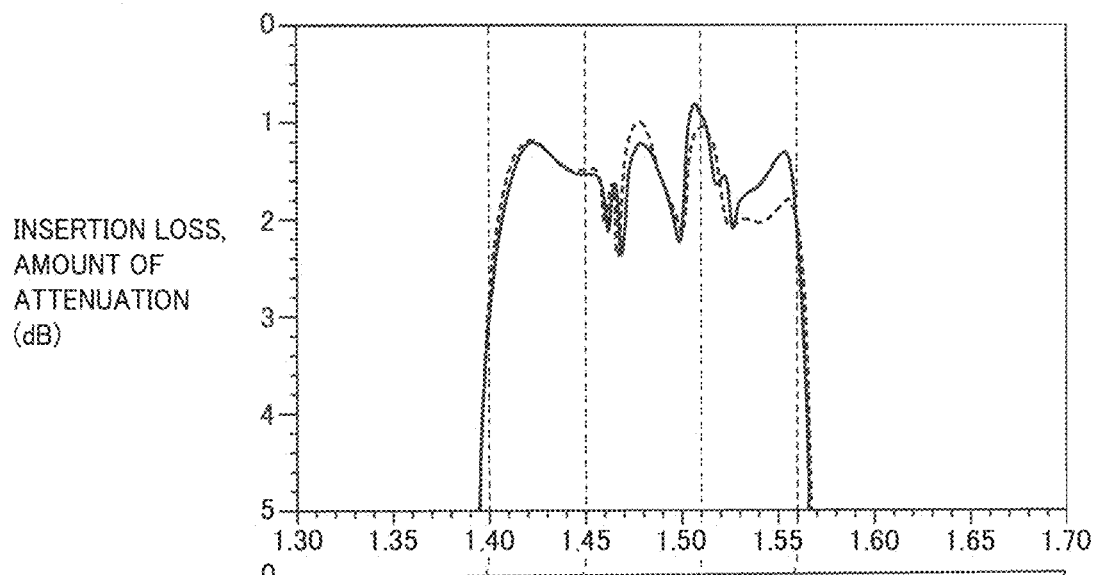
FIG. 19(a) and FIG. 19(b) are graphs that show pass characteristics of the filter devices and pass characteristics of the low band sided filters according to Embodiments 3 and 4.
Figure 19B:
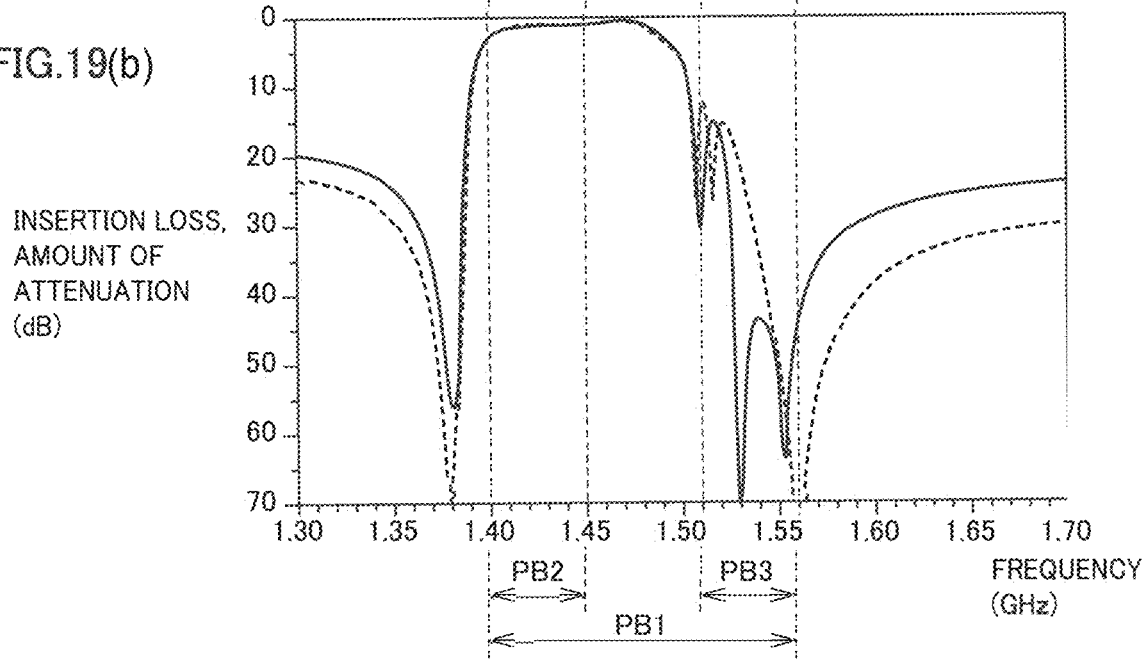

FIG. 19(a) and FIG. 19(b) respectively show pass characteristics of the filter devices and the pass characteristics of the low band sided filters according to Embodiments 3 and 4. FIG. 19(a) shows the pass characteristic of filter device 3 (dotted line) and the pass characteristic of filter device 4 (solid line). FIG. 19(b) shows the pass characteristic of filter FLT 31 in Embodiment 3 (dotted line) and the pass characteristic of filter FLT 31 in Embodiment 4 (solid line). A bulk wave loss is reduced more in Embodiment 4 than in Embodiment 3. At the high band edge of passband PB1, thus, an insertion loss of filter device 4 is smaller than an insertion loss of filter device 3, as shown in FIG. 19(a).

Modification of Embodiment 4

A series arm resonator or a parallel arm resonator may have a configuration in which multiple elastic wave resonators are connected in series with each other. In other words, a series arm resonator or a parallel arm resonator may be formed of multiple elastic wave resonators, which are obtained by dividing one elastic wave resonator in series. Dividing a series arm resonator or a parallel arm resonator in series into multiple elastic wave resonators can increase the area of the resonator to reduce the amount of heat generation per unit area. In particular, series arm resonators at the opposite ends receive radio-frequency power from the input-output terminal directly and intensively, and accordingly, more easily generate heat. Accordingly, at least one of the series arm resonators at the opposite ends, which receive radio-frequency power, is highly required to be formed by serial division. Also, the area of a series arm resonator decreases with a smaller capacitance, and accordingly, a series arm resonator that has a smaller capacitance for a reduced bulk wave loss is highly required to be formed by series division.

In Embodiment 4, series arm resonators s14, which are series arm resonators at the opposite ends and have a capacitance smaller than that of any other series arm resonator, are most required to be formed by series division. Thus, a modification of Embodiment 4 will describe a case where series arm resonator s14 is divided in series.

Figure 20:
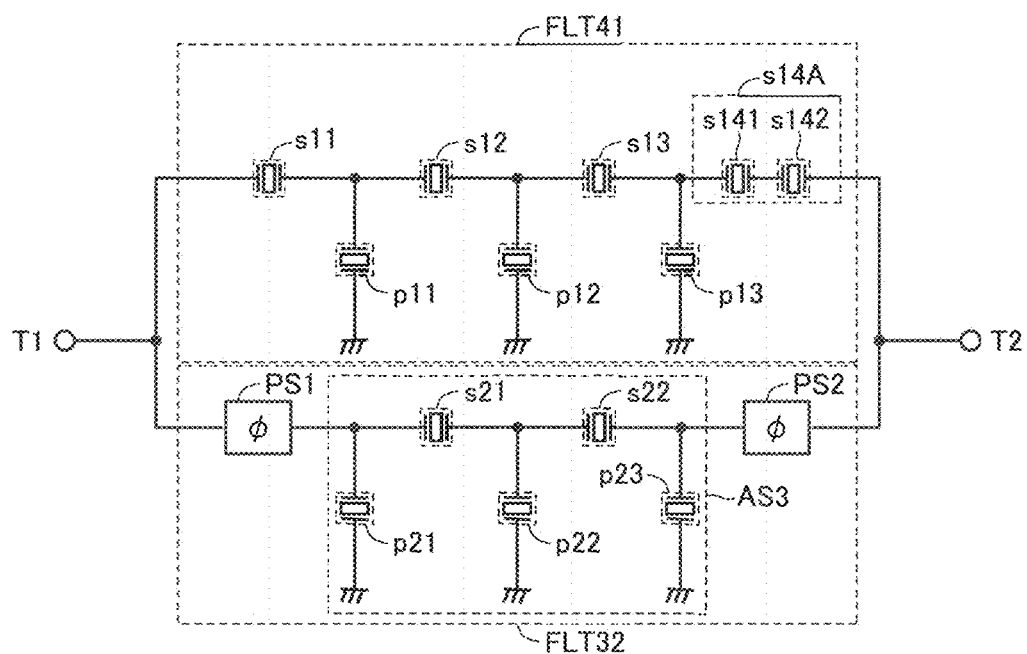
FIG. 20 is a circuit configuration diagram of a filter device according to a modification of Embodiment 4.

FIG. 20 is a circuit configuration diagram of a filter device 4A according to the modification of Embodiment 4. Filter device 4A has a configuration obtained by replacing filter FLT 31 of filter device 4 in FIG. 12 with a FLT 41 (first filter). Filter FLT 41 has a configuration obtained by replacing series arm resonator s14 of filter FLT 31 with a series arm resonator s14A. The other components are similar to those of Embodiment 4, description of which will not be repeated.

As shown in FIG. 20, series arm resonator s14A is divided in series into elastic wave resonators s141 and s142. The capacitance of series arm resonator s14A is smaller than the capacitance of each of series arm resonators s12 and s13, similarly to series arm resonator s14. However, series arm resonator s14A, which is divided in series, has a size larger than the size of series arm resonator s14. The amount of heat generation per unit area of series arm resonator s14A is thus smaller than the amount of heat generation per unit area of series arm resonator s14. The power durability of series arm resonator s14A is higher than the power durability of series arm resonator s14.

As described above, the filter devices according to Embodiment 4 and the modification can improve power durability and also reduce an insertion loss at the high band edge of a passband.

Embodiment 5

Embodiment 5 will describe a configuration for switching between a bandpass filter configuration formed of a low band sided filter and a high band sided filter and a multiplexer configuration with a passband of a low band sided filter and a passband of a high band sided filter.

Figure 21:
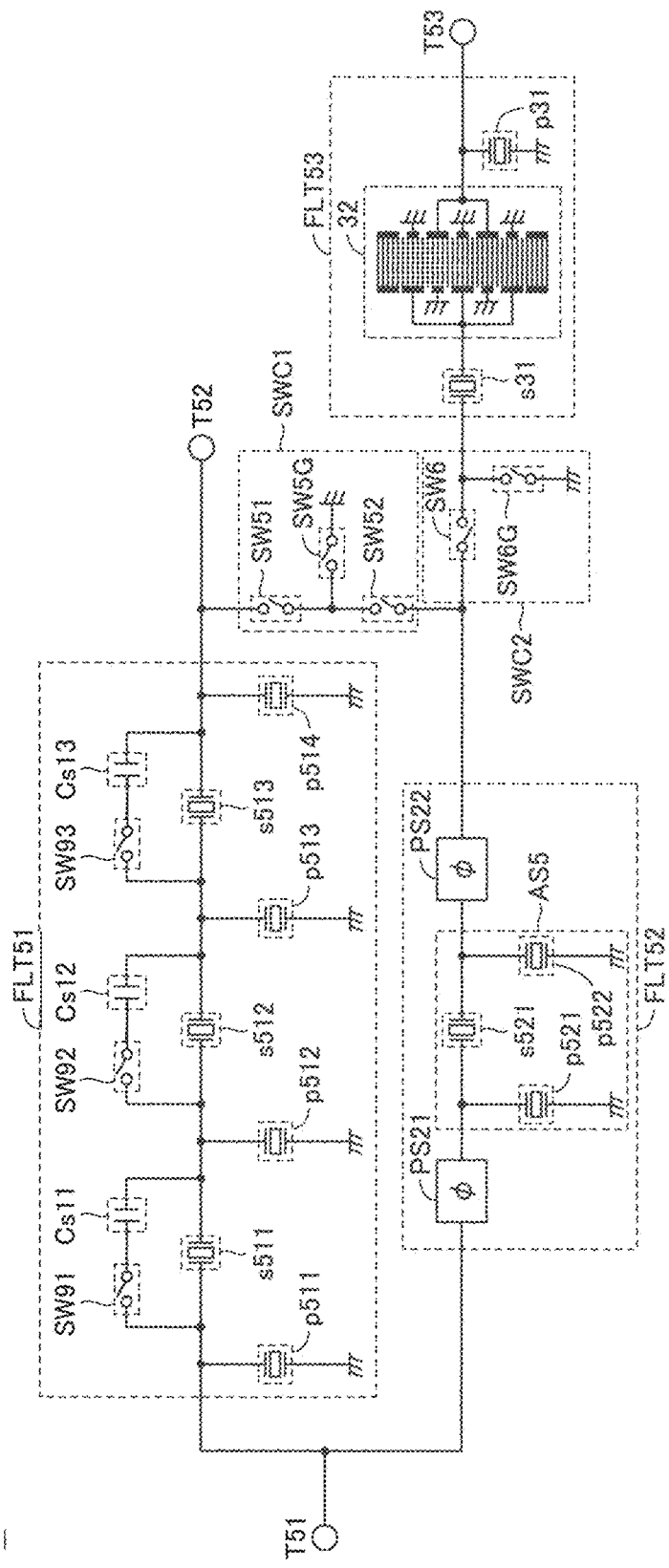
FIG. 21 is a circuit configuration diagram of a filter device according to Embodiment 5.

FIG. 21 is a circuit configuration diagram of a filter device 5 according to Embodiment 5. As shown in FIG. 21, filter device 5 includes a filter FLT51 (first filter), a filter FLT52 (second filter), a filter FLT53, a switch circuit SWC1 (first switch), a switch circuit SWC2 (second switch), a common terminal T51 (first terminal), an input-output terminal T52 (second terminal), and an input-output terminal T53 (third terminal). Filter device 5, filter FLT51, and filter FLT52 have a passband PB51 (first passband), a passband PB52 (second passband), and a passband PB53 (third passband), respectively. Filter FLT51 is a low band sided filter, and filter FLT52 is a high band sided filter. Filter FLT53 has passband PB53.

Passband PB51 includes part of passband PB52 and part of passband PB53. Passband PB52 is narrower than passband PB51. Passband PB53 is narrower than passband PB51. Passband PB53 has a center frequency higher than the center frequency of passband PB52. Passbands PB52 and PB53 do not overlap each other.

Filter FLT52 and switch circuit SWC1 are connected in series with each other in this order between common terminal T51 and input-output terminal T52. Between common terminal T51 and input-output terminal T52, filter FLT51 is connected in parallel with filter FLT52 and switch circuit SWC1 connected in series. Switch circuit SWC2 and filter FLT53 are connected in series with each other in this order between input-output terminal T53 and a connecting point between filter FLT52 and switch circuit SWC1.

Switch circuit SWC1 includes switches SW51, SW52, and SW5G. Switches SW51 and SW52 are connected in series with each other between filter FLT52 and input-output terminal T52. Switch SW5G is connected between a grounding point and a connecting point between switches SW51 and SW52. The conductive states of switches SW51 and SW52 are synchronous with each other. The conductive states of switch SW51 (SW52) and switch SW5G are switched exclusively.

Switch circuit SWC2 includes switches SW6 and SW6G. Filter FLT52, switch SW6, and filter FLT53 are connected in series with each other in this order between common terminal T51 and input-output terminal T53. Switch SW6G is connected between the grounding point and a connecting point between switch SW6 and filter FLT53. The conductive states of switches SW6 and SW6G are switched exclusively.

Filter FLT51 includes a series arm resonator s511 (first series arm resonator), a series arm resonator s512 (second series arm resonator), a series arm resonator s513 (third series arm resonator), parallel arm resonators p511 to p514, a switch SW91, a switch SW92, a switch SW93, a capacitor Cs11 (capacitive element), a capacitor Cs12 (capacitive element), and a capacitor Cs13 (capacitive element).

Series arm resonator s511 has a fractional bandwidth different from the fractional bandwidth of series arm resonator s512. Series arm resonator s513 has a fractional bandwidth different from the fractional bandwidth of series arm resonator s512.

Series arm resonators s511 to s513 are connected in series with each other between common terminal T51 and input-output terminal T52. Parallel arm resonator p511 is connected between a grounding point and a connecting point between common terminal T51 and series arm resonator s511. Parallel arm resonator p512 is connected between the grounding point and a connecting point between series arm resonators s511 and s512. Parallel arm resonator p513 is connected between the grounding point and a connecting point between series arm resonators s512 and s513. Parallel arm resonator p514 is connected between the grounding point and a connecting point between series arm resonator s513 and input-output terminal T52.

Switches SW91 to SW93 are connected in series with capacitors Cs11 to Cs13, respectively. Switch SW91 and capacitor Cs11 are connected in parallel with series arm resonator s511. Switch SW92 and capacitor Cs12 are connected in parallel with series arm resonator s512. Switch SW93 and capacitor Cs13 are connected in parallel with series arm resonator s513. The pass characteristic of filter FLT51 differs between the case where switches SW91 to SW93 are ON and the case where switches SW91 to SW93 are OFF.

The conductive states of switches SW51, SW52, and SW5G, switches SW6 and SW6G, and switches SW91 to SW93 are switched in response to, for example, a control signal from a control circuit included in an RFIC (not shown). The control circuit may be provided separately from the RFIC.

Filter FLT52 includes a phase shifter PS21 (first phase shifter), a phase shifter PS22 (second phase shifter), and a filter circuit AS5. Filter circuit AS5 includes a series arm resonator s521, a parallel arm resonator p521 (first parallel arm resonator), and a parallel arm resonator p522 (second parallel arm resonator).

Phase shifter PS21 is connected between common terminal T51 and series arm resonator s521. Phase shifter PS22 is connected between series arm resonator s521 and switch SW6. Phase shifters PS21 and PS22 are configured to increase the impedance of filter FLT52 in passband PB52 of filter FLT51.

Filter FLT53 includes a series arm resonator s31, a longitudinally coupled resonator 32, and a parallel arm resonator p31. Series arm resonator s31 and longitudinally coupled resonator 32 are connected in series with each other between switch SW6 and input-output terminal T53. Parallel arm resonator p31 is connected between a grounding point and a connecting point between longitudinally coupled resonator 32 and input-output terminal T53. Longitudinally coupled resonator 32 is formed of, for example, multiple interdigital transducer (IDT) electrodes placed side by side between two reflectors. Longitudinally coupled resonator 32 may include no reflector.

Figure 22:
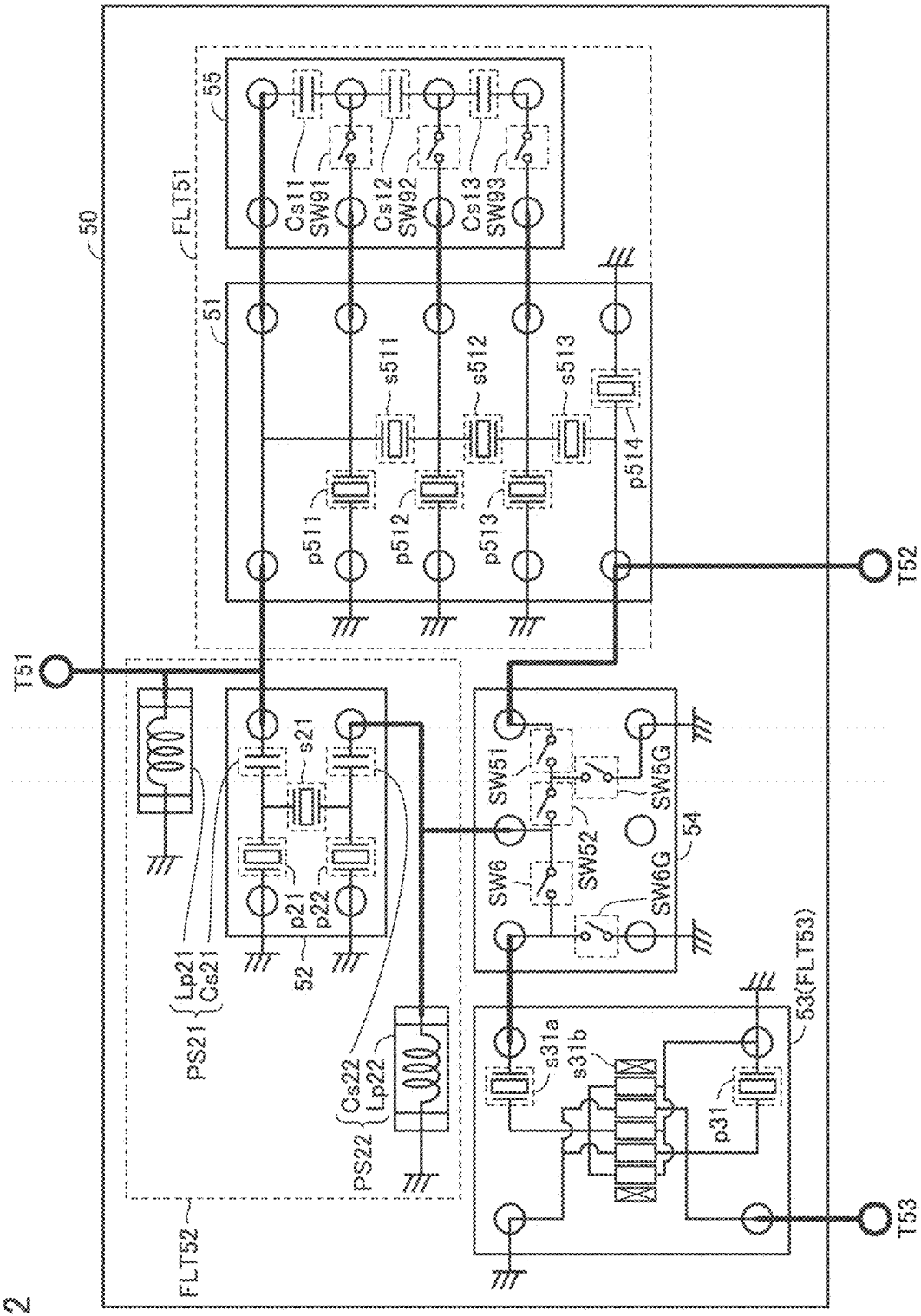
FIG. 22 shows an example module configuration of the filter device in FIG. 21.

FIG. 22 shows an example module configuration of filter device 5 in FIG. 21. As shown in FIG. 22, packages (chips) 51 to 55 and inductors Lp521 and Lp522 are mounted on circuit board 50.

Packages 51 to 53 are packages for resonators. Packages 54 and 55 are packages for switches. Packages 51 to 55 each have, on its bottom surface, surface electrodes for mounting on circuit board 50. The surface electrode is indicated by a circle in FIG. 22. FIG. 22 schematically shows circuit elements and lines configured in each package for ease of interpretation of a package structure, and shows the surface electrodes on the bottom surface of each package through each of packages 51 to 55.

Circuit board 50 has externally connected electrodes individually forming common terminal T51 and input-output terminals T52 and T53. This externally connected electrode is a surface electrode for mounting of circuit board 50 on a mother board or the like, or a connector connecting circuit board 50 with any other electronic component.

Series arm resonators s511 to s513 and parallel arm resonators p511 to p514 are mounted on package 51. Switches SW91 to SW93 and capacitors Cs11 to Cs13 are mounted on package 55. Packages 51 and 55 form filter FLT51.

Series arm resonator s521, parallel arm resonators p521 and p522, and capacitors Cs21 and Cs22 are mounted on package 52. Inductor Lp521 and capacitor Cs21 form phase shifter PS21. Inductor Lp522 and capacitor Cs22 form phase shifter PS22. Package 52 and inductors Lp521 and Lp522 form filter FLT52.

Series arm resonator s31, parallel arm resonator p31, and longitudinally coupled resonator 32 are mounted on package 53. Package 53 forms filter FLT53. Switches SW51, SW52, SW5G, SW6, and SW6G are formed in package 54.

Switches SW51, SW52, SW5G, SW6, and SW6G, switches SW91 to SW93, and capacitors Cs11 to Cs13, Cs21, and Cs22 may be modularized in a configuration different from the above configuration. For example, capacitors Cs11 to Cs13 may be mounted on packages for resonators, not on packages for switches, or may be mounted in circuit board 50.

Figure 23:
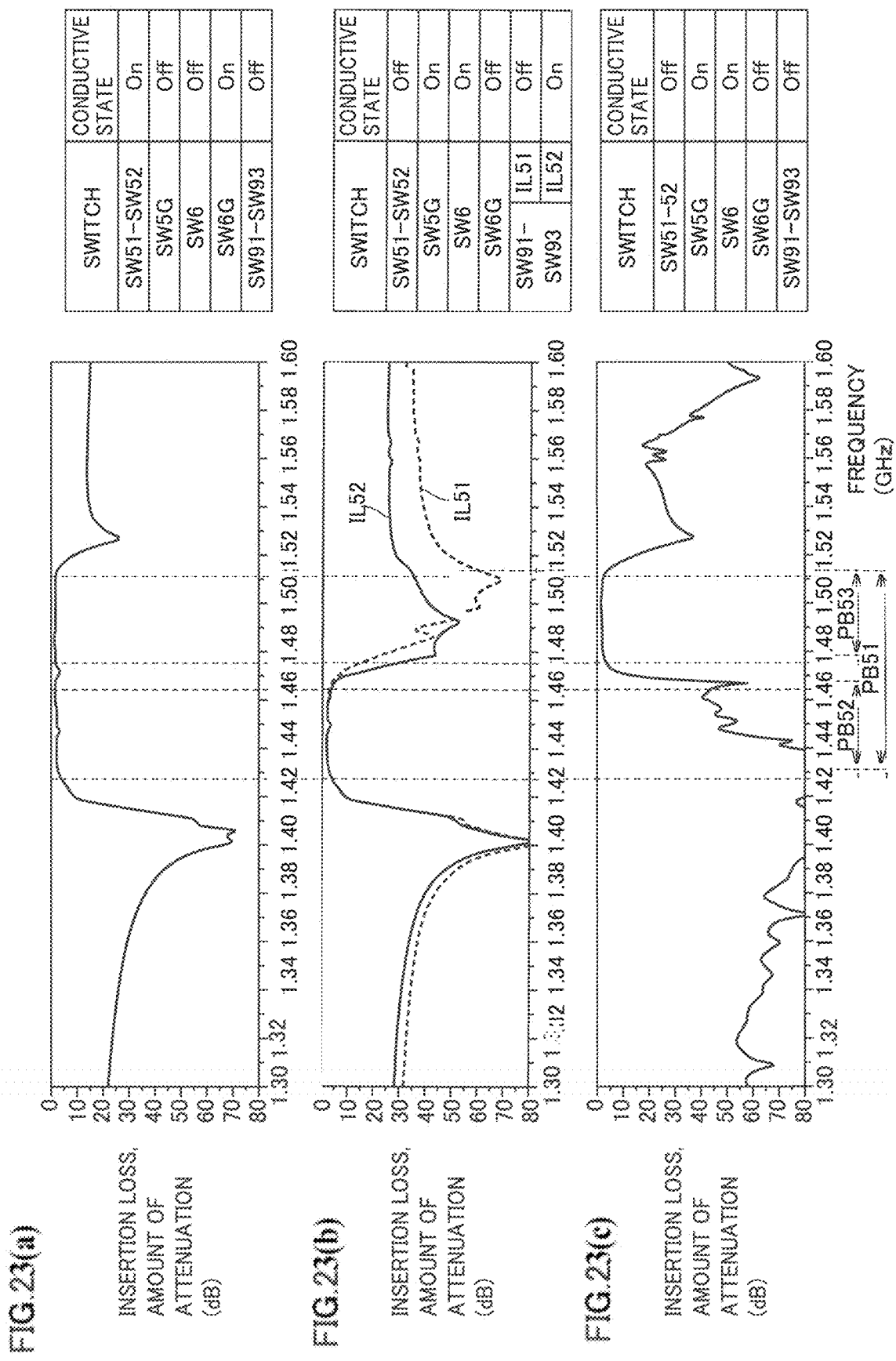
FIG. 23(a), FIG. 23(b), and FIG. 23(c) are graphs showing pass characteristics of the filter device in FIG. 21 and conductive states of the respective switches.

FIG. 23(a), FIG. 23(b), and FIG. 23(c) show pass characteristics of the filter device in FIG. 21 and the conductive states of switches SW51, SW52, SW5G, SW6, SW6G, and SW91 to SW93.

Referring to FIGS. 21 and 23(a)/(b)/(c), FIG. 23(a) shows a pass characteristic between common terminal T51 and input-output terminal T52 in the case where switches SW51, SW52, and SW6G are ON and switches SW5G, SW6, and SW91 to SW93 are OFF. The passband between common terminal T51 and input-output terminal T52 with the conductive states of the switches shown in FIG. 23(a) is passband PB51 formed by filters FLT51 and FLT52. In this case, no radio-frequency signal is input to and output from input-output terminal T53.

FIG. 23(b) is a chart showing a pass characteristic IL51 between common terminal T51 and input-output terminal T52 in the case where switches SW51, SW52, SW6G, and SW91 to SW93 are OFF and switch SW5G and switch SW6 are ON and a pass characteristic IL52 between common terminal T51 and input-output terminal T52 in the case where switches SW51, SW52, and SW6G are OFF and switch SW5G, and switch SW6 and SW91 to SW93 are ON. The passband between common terminal T51 and input-output terminal T52 with the conductive states of the switches shown in FIG. 23(b) is passband PB52 formed by filter FLT51.

FIG. 23(c) shows a pass characteristic between common terminal T51 and input-output terminal T53 in the case where switches SW51, SW52, SW6G, and SW91 to SW93 are OFF and switches SW5G and SW6 are ON. The passband between common terminal T51 and input-output terminal T53 with the conductive states of the switches shown in FIG. 23(c) is passband PB53 formed by filter FLT52. A similar pass characteristic is obtained even when SW91 to SW93 are ON.

Referring to FIG. 23(b), pass characteristics IL51 and IL52 change in passband PB52 in substantially the same manner. At frequencies higher than passband PB52, an attenuation pole occurs at frequencies at which pass characteristic IL52 is smaller than pass characteristic IL51. Consequently, in the frequency band between passband PB52 and passband PB53, pass characteristic IL52 increases more steeply than pass characteristic IL51 does. In passband PB53, pass characteristics IL51 and IL52 change in different manners. Filter device 5 can change the pass characteristic of filter FLT51 by switching the conductive states of switches SW91 to SW93.

Filter device 5 can reduce an insertion loss at a high band edge of passband PB51 with the conductive states of the switches shown in FIG. 23(a). Also, filter device 5 can switch between the bandpass filter configuration with passband PB51 (the conductive states of the switches in FIG. 23(a)) and the multiplexer configuration with passband PB52 and passband PB53 (the conductive states of the switches shown in FIG. 23(b) and FIG. 23(c)).

As described above, the filter device according to Embodiment 5 can reduce an insertion loss of a passband.

Embodiment 6

Embodiment 6 will describe a radio-frequency front-end circuit and a communication apparatus that can be implemented using the filter device described in each of Embodiments 1 to 5.

Figure 24:
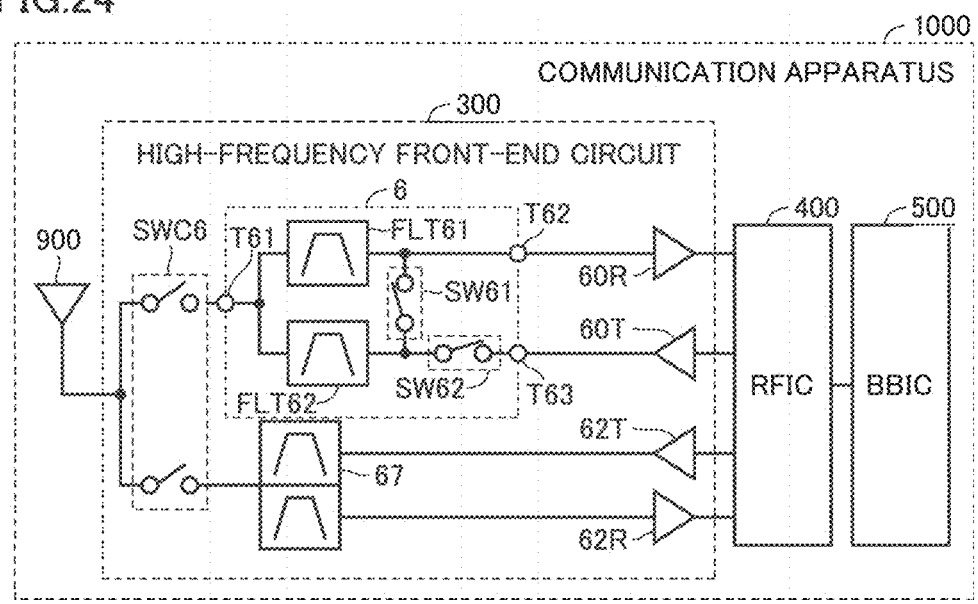
FIG. 24 is a configuration diagram of a communication apparatus according to Embodiment 6.

FIG. 24 is a configuration diagram of a communication apparatus 1000 according to Embodiment 6. As shown in FIG. 24, communication apparatus 1000 includes a radio-frequency front-end circuit 300, an RFIC 400, a baseband integrated circuit (BBIC) 500, and an antenna element 900.

Radio-frequency front-end circuit 300 includes a filter device 6, a switch circuit SWC6, a duplexer 67, transmission amplifier circuits 60T and 62T, and reception amplifier circuits 60R and 62R.

Filter circuit SWC6 is connected to antenna element 900, filter device 6, and duplexer 67. Filter circuit SWC6 switches between the connection between antenna element 900 and filter device 6 and the connection between antenna element 900 and duplexer 67.

Filter device 6 includes a filter FLT61 (first filter), a filter FLT62 (second filter), a common terminal T61 (first terminal), an input-output terminal T62 (second terminal), an input-output terminal T63 (third terminal), a switch SW61 (first switch), and a switch SW62 (second switch). The passbands of filter device 6, filter FLT61, and filter FLT62 are a passband PB61 (first passband), a passband PB62 (second passband), and a passband PB63 (third passband), respectively. Filter FLT61 is a low band sided filter, and filter FLT62 is a high band sided filter.

Passband PB61 includes part of passband PB62 and part of passband PB63. Passband PB62 is narrower than passband PB61. Passband PB63 is narrower than passband PB61. Passband PB63 has a center frequency higher than the center frequency of passband PB62. Passbands PB62 and PB63 do not overlap each other.

Filter FLT62 and switch SW61 are connected in series with each other in this order between common terminal T61 and input-output terminal T62. Between common terminal T61 and input-output terminal T62, filter FLT61 is connected in parallel with filter FLT62 and switch SW61 connected in series. Switch SW62 is connected between input-output terminal T63 and a connecting point between filter FLT62 and switch SW61.

Filter device 6 can be implemented by adding switches SW61 and SW62 and input-output terminal T63 to the filter device according to each of Embodiments 1 to 4. Filter device 6 can also be implemented as the filter device according to Embodiment 5.

Common terminal T61 is connected to switch circuit SWC6. Input-output terminal T62 is connected to reception amplifier circuit 60R. Input-output terminal T63 is connected to transmission amplifier circuit 60T.

Transmission amplifier circuit 60T is a power amplifier that amplifies the power of a radio-frequency signal in a predetermined frequency band. Reception amplifier circuit 60R is a low-noise amplifier that amplifies the power of a radio-frequency signal in a predetermined frequency band.

Duplexer 67 has a transmission terminal and a reception terminal. Duplexer 67 has frequency bands different from passbands PB61 to PB63 as a transmission band and a reception band.

Transmission amplifier circuit 62T is connected to the transmission terminal of duplexer 67. Transmission amplifier circuit 62T is a power amplifier that amplifies the power of a radio-frequency transmission signal in a predetermined frequency band. Reception amplifier circuit 62R is connected to the reception terminal of duplexer 67. Reception amplifier circuit 62R is a low-noise amplifier that amplifies the power of a radio-frequency signal in a predetermined frequency band.

RFIC 400 processes radio-frequency signals transmitted and received by antenna element 900. Specifically, RFIC 400 processes a radio-frequency signal input from antenna element 900 through a receiving-side signal path thereto by down conversion or the like and outputs the signal to BBIC 500. RFIC 400 processes a transmission signal input from BBIC 500 by up conversion or the like and outputs the signal.

RFIC 400 outputs a control signal for switching the conductive state to each of switch circuit SWC6 and switches SW61 and SW62. This control signal may be output from a control circuit provided separately from the RFIC.

Modification of Embodiment 6

The case where the second switch is connected between the third input-output terminal and the connecting point between the second filter and the first switch has been described for filter device 6. In the filter device according to Embodiment 6, switch SW62 (second switch) may be connected between input-output terminal T62 (second terminal) and a connecting point between low band sided filter FLT61

Figure 25:
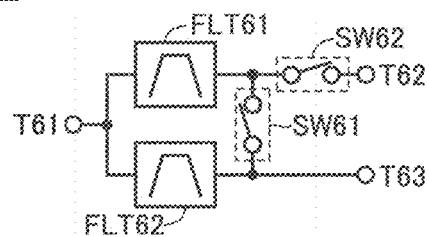
FIG. 25 is a circuit configuration diagram of a filter device according to a modification of Embodiment 6.

(first filter) and switch SW61 (first switch), as in a filter device 6A according to a modification of Embodiment 6 shown in FIG. 25.

As described above, the communication apparatuses according to Embodiment 6 and the modification can improve communication quality by a filter device which has a reduced insertion loss at a high band edge.

The presently disclosed embodiments are also expected to be combined and implemented as appropriate within a consistent range. The presently disclosed embodiments should be considered in all aspects as illustrative and not restrictive. The scope of the present disclosure is defined by the appended claims, rather than by the description above. All changes which come within the meaning and range of equivalency of the appended claims are to be embraced within their scope.

REFERENCE SIGNS LIST 1-6, 1A, 4A, 6A, 100, 200: filter device; 32: longitudinally coupled resonator; 50: circuit board; 51-55 package; 60R, 62R: reception amplifier circuit; 60T, 62T: transmission amplifier circuit, 67: duplexer; 300: radio-frequency front-end circuit; 900: antenna element; 1000: communication apparatus; AS1-AS3: filter circuit, Cs11-Cs13, Cs21, Cs22: capacitor; FLT1, FLT2, FLT 31, FLT32, FLT 41, FLT51-FLT53, FLT61-FLT63: filter; 400: RFIC; Lp521, Lp522: inductor; PS1, PS2, PS21, PS22: phase shifter; SW1-SW4, SW5G, SW6, SW6G, SW51, SW52, SW61, SW62, SW91-SW93: switch; SWC1, SWC2, SWC6: switch circuit; T1, T2, T52, T53, T62, T63: input-output terminal; T51, T61: common terminal; p11-p13, p21-p23, p31, p511-p514, p521, p522: parallel arm resonator; s11-s14, s14A, s21, s22, s31, s511-s513, s521: series arm resonator; s141, s142: elastic wave resonator.

The invention claimed is:

1. A filter device having a first passband, the filter device comprising:
a first filter and a second filter connected in parallel with each other between a first terminal and a second terminal, wherein
the first passband of the filter device includes at least part of a second passband of the first filter and at least part of a third passband of the second filter,
the second passband and the third passband being narrower than the first passband of the filter device,
the third passband having a center frequency higher than a center frequency of the second passband,
the first filter includes a plurality of series arm resonators connected in series with each other in a path from the first terminal via the first filter to the second terminal,
the plurality of series arm resonators include a first series arm resonator and a second series arm resonator, and
under a condition that a value obtained by dividing a difference between an antiresonance frequency and a resonance frequency of each series arm resonator by the resonance frequency is defined as a fractional bandwidth, a first fractional bandwidth of the first series arm resonator is different from a second fractional bandwidth of the second series arm resonator.

2. The filter device according to claim 1, wherein the plurality of series arm resonators further include a third series arm resonator,
in the path from the first terminal via the first filter to the second terminal, the plurality of series arm resonators are connected in series with each other with the first series arm resonator and the third series arm resonator located at opposite ends, and
the third series arm resonator has a third fractional bandwidth different from the second fractional bandwidth.

3. The filter device according to claim 2, wherein the first fractional bandwidth is larger than the second fractional bandwidth, and
the third fractional bandwidth is larger than the second fractional bandwidth.

4. The filter device according to claim 2, wherein at least one of a capacitance of the first series arm resonator and a capacitance of the third series arm resonator is smaller than a capacitance of the second series arm resonator.

5. The filter device according to claim 3, wherein at least one of a capacitance of the first series arm resonator and a capacitance of the third series arm resonator is smaller than a capacitance of the second series arm resonator.

6. The filter device according to claim 2, wherein each of the first series arm resonator, the second series arm resonator, and the third series arm resonator includes at least one elastic wave resonator, and at least one of the first series arm resonator and the third series arm resonator includes more elastic wave resonators than the second series arm resonator.

7. The filter device according to claim 3, wherein each of the first series arm resonator, the second series arm resonator, and the third series arm resonator includes at least one elastic wave resonator, and at least one of the first series arm resonator and the third series arm resonator includes more elastic wave resonators than the second series arm resonator.

8. The filter device according to claim 4, wherein each of the first series arm resonator, the second series arm resonator, and the third series arm resonator includes at least one elastic wave resonator, and at least one of the first series arm resonator and the third series arm resonator includes more elastic wave resonators than the second series arm resonator.

9. The filter device according to claim 5, wherein each of the first series arm resonator, the second series arm resonator, and the third series arm resonator includes at least one elastic wave resonator, and at least one of the first series arm resonator and the third series arm resonator includes more elastic wave resonators than the second series arm resonator.

10. The filter device according to claim 1, further comprising:
a first switch, a second switch, a third switch, and a fourth switch, wherein
the first switch, the first filter, and the second switch are connected in series with each other in this order between the first terminal and the second terminal,
the third switch, the second filter, and the fourth switch are connected in series with each other in this order between the first terminal and the second terminal, and
between the first terminal and the second terminal, the first switch, the first filter, and the second switch which are connected in series are connected in parallel with the third switch, the second filter, and the fourth switch which are connected in series.

11. The filter device according to claim 1, further comprising:
a first switch and a second switch, wherein
the second filter and the first switch are connected in series with each other in this order between the first terminal and the second terminal,
between the first terminal and the second terminal, the first filter is connected in parallel with the second filter and the first switch which are connected in series, the second switch is connected between a third terminal and a third connecting node between the second filter and the first switch, and the second passband and the third passband do not overlap each other.

12. The filter device according to claim 1, further comprising:

a first switch and a second switch, wherein the first filter and the first switch are connected in series with each other in this order between the first terminal and a third terminal, between the first terminal and the third terminal, the second filter is connected in parallel with the first filter and the first switch which are connected in series, the second switch is connected between the second terminal and a third connecting node between the first filter and the first switch, and the second passband and the third passband do not overlap each other.

13. A filter device having a first passband, the filter device comprising:

a first filter and a second filter connected in parallel with each other between a first terminal and a second terminal, wherein the first passband of the filter device includes at least part of a second passband of the first filter and at least part of a third passband of the second filter, the second passband and the third passband being narrower than the first passband of the filter device, the third passband having a center frequency higher than a center frequency of the second passband, the second filter includes a first parallel arm resonator connected between a grounding node and a first connecting node on a path from the first terminal via the second filter to the second terminal, and a second parallel arm resonator connected between the grounding node and a second connecting node on the path from the first terminal via the second filter to the second terminal, the second connecting node being different from the first connecting node, and under a condition that a value obtained by dividing a difference between an antiresonance frequency and a resonance frequency of each parallel arm resonator by the resonance frequency is defined as a fractional bandwidth, a fractional bandwidth of the first parallel arm resonator is different from a fractional bandwidth of the second parallel arm resonator.

14. The filter device according to claim 13, wherein the second filter includes a filter circuit including the first parallel arm resonator and the second parallel arm resonator, a first phase shifter disposed in a path between the filter circuit and the first terminal, and a second phase shifter disposed in a path between the filter circuit and the second terminal, and the first phase shifter and the second phase shifter are configured to increase an impedance of the second filter in the second passband.

15. The filter device according to claim 13, further comprising:

a first switch, a second switch, a third switch, and a fourth switch, wherein the first switch, the first filter, and the second switch are connected in series with each other in this order between the first terminal and the second terminal, the third switch, the second filter, and the fourth switch are connected in series with each other in this order between the first terminal and the second terminal, and between the first terminal and the second terminal, the first switch, the first filter, and the second switch which are connected in series are connected in parallel with the third switch, the second filter, and the fourth switch which are connected in series.

16. The filter device according to claim 13, further comprising:

a first switch and a second switch, wherein the second filter and the first switch are connected in series with each other in this order between the first terminal and the second terminal, between the first terminal and the second terminal, the first filter is connected in parallel with the second filter and the first switch which are connected in series, the second switch is connected between a third terminal and a third connecting node between the second filter and the first switch, and the second passband and the third passband do not overlap each other.

17. The filter device according to claim 13, further comprising:

a first switch and a second switch, wherein the first filter and the first switch are connected in series with each other in this order between the first terminal and a third terminal, between the first terminal and the third terminal, the second filter is connected in parallel with the first filter and the first switch which are connected in series, the second switch is connected between the second terminal and a third connecting node between the first filter and the first switch, and the second passband and the third passband do not overlap each other.

18. A radio-frequency front-end circuit comprising:

a filter device having a passband, the filter device having a first filter and a second filter connected in parallel with each other between a first terminal and a second terminal, wherein the passband of the filter device includes at least part of a second passband of the first filter and at least part of a third passband of the second filter, the second passband and the third passband being narrower than the passband of the filter device, the third passband having a center frequency higher than a center frequency of the second passband, the first filter includes a plurality of series arm resonators connected in series with each other in a path from the first terminal via the first filter to the second terminal, the plurality of series arm resonators include a first series arm resonator and a second series arm resonator, and under a condition that a value obtained by dividing a difference between an antiresonance frequency and a resonance frequency of each series arm resonator by the resonance frequency is defined as a fractional bandwidth, a first fractional bandwidth of the first series arm resonator is different from a second fractional bandwidth of the second series arm resonator; and an amplifier circuit electrically connected to the filter device.

19. A communication apparatus comprising:
a radio-frequency (RF) signal processing circuit that processes a radio-frequency signal transmitted and received by an antenna element; and
a RF front-end circuit according to claim 18 that transmits the radio-frequency signal between the antenna element and the RF signal processing circuit.

* * * * *